(12) United States Patent
Kitamura et al.

(10) Patent No.: US 10,483,357 B2
(45) Date of Patent: Nov. 19, 2019

(54) SEMICONDUCTOR DEVICE

(71) Applicant: FUJI ELECTRIC CO.,LTD., Kanagawa (JP)

(72) Inventors: Mutsumi Kitamura, Matsumoto (JP); Tohru Shirakawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/136,285

(22) Filed: Sep. 20, 2018

(65) Prior Publication Data
US 2019/0140058 A1 May 9, 2019

(30) Foreign Application Priority Data

Nov. 6, 2017 (JP) .................. 2017-214256

(51) Int. Cl.
*H01L 29/40* (2006.01)
*H01L 29/739* (2006.01)
(Continued)

(52) U.S. Cl.
CPC ........ *H01L 29/404* (2013.01); *H01L 27/0664* (2013.01); *H01L 27/0727* (2013.01);
(Continued)

(58) Field of Classification Search
CPC ....... H01L 29/06; H01L 29/40; H01L 29/404; H01L 29/739; H01L 29/7397; H01L 29/08; H01L 29/0813; H01L 29/861; H01L 29/66; H01L 29/7395; H01L 29/66333; H01L 29/6609; H01L 29/7391; H01L 29/66712; H01L 29/0646; H01L 29/74; H01L 27/06; H01L 27/0664; H01L 27/0727; H01L 27/0623; H01L 27/082
(Continued)

(56) References Cited

U.S. PATENT DOCUMENTS

2007/0108468 A1* 5/2007 Takahashi ........... H01L 29/0696
257/133
2008/0102576 A1* 5/2008 Suzuki ................ H01L 29/0834
438/237
(Continued)

FOREIGN PATENT DOCUMENTS

JP 2016096222 A 5/2016
WO 2016080269 A1 5/2016

*Primary Examiner* — Chuong A Luu

(57) ABSTRACT

A semiconductor device including: a semiconductor substrate having a drift region of the first conductivity type; a cathode region formed on the lower surface of the semiconductor substrate; a diode portion having the cathode region formed on the lower surface of the semiconductor substrate; the first dummy trench portion provided from the upper surface of the semiconductor substrate to the drift region, including one part provided inside the diode portion and the other part provided outside the diode portion, and provided extending in series from inside the diode portion to outside the diode portion in a predetermined extending direction on the upper surface of the semiconductor substrate; and the first lead-out portion that is provided on the upper surface of the semiconductor substrate, and electrically connected to the first dummy trench portion outside the diode portion is provided.

12 Claims, 18 Drawing Sheets

(51) Int. Cl.
*H01L 29/08* (2006.01)
*H01L 27/06* (2006.01)
*H01L 29/861* (2006.01)
*H01L 27/07* (2006.01)

(52) U.S. Cl.
CPC ........ *H01L 29/0813* (2013.01); *H01L 29/407* (2013.01); *H01L 29/7397* (2013.01); *H01L 29/861* (2013.01)

(58) Field of Classification Search
USPC .......................................................... 257/140
See application file for complete search history.

(56) References Cited

U.S. PATENT DOCUMENTS

| | | | |
|---|---|---|---|
| 2014/0361333 A1* | 12/2014 | Kimura | H01L 29/7397 257/140 |
| 2016/0141400 A1 | 5/2016 | Takahashi | |
| 2017/0047322 A1 | 2/2017 | Yoshida et al. | |

\* cited by examiner a-a' b-b'

SEMICONDUCTOR DEVICE

The contents of the following Japanese patent application(s) are incorporated herein by reference:
NO. 2017-214256 filed in JP on Nov. 6, 2017.

BACKGROUND

1. Technical Field

The present invention relates to a semiconductor device.

2. Related Art

Conventionally, a semiconductor device such as an insulated gate type bipolar transistor (IGBT) is known (refer to Patent Document 1, for example).
Patent Document 1: Japanese Patent Application Publication No. 2016-96222.

In a semiconductor device, it is desirable to improve the degree of freedom in arranging a diode portion.

SUMMARY

In one aspect of the present invention, a semiconductor device including: a semiconductor substrate having a drift region of a first conductivity type; a cathode region formed on the lower surface of the semiconductor substrate; a diode portion having the cathode region formed on the lower surface of the semiconductor substrate; a first dummy trench portion provided from the upper surface of the semiconductor substrate to the drift region, including one part provided inside the diode portion and the other part provided outside the diode portion, and provided extending in series from inside the diode portion to outside the diode portion in a predetermined extending direction on the upper surface of the semiconductor substrate; and a first lead-out portion that is provided on the upper surface of the semiconductor substrate, and electrically connected to the first dummy trench portion outside the diode portion is provided.

When the semiconductor substrate is seen from above, the semiconductor device may further include a transistor portion provided adjacent to the diode portion in the extending direction on the semiconductor substrate. The transistor portion has the first dummy trench portions, and the first dummy trench portions may be arrayed at a predetermined trench pitch in the array direction orthogonal to the extending direction, in the diode portion and the transistor portion when the semiconductor substrate is seen from above.

The semiconductor device may further include a second lead-out portion provided on the upper surface of the semiconductor substrate. The transistor portion may further have a second dummy trench portions inwardly provided from the upper surface of the semiconductor substrate, extending in the extending direction. The second dummy trench portions are electrically connected to the second lead-out portions. The first lead-out portions and the second lead-out portions may be arrayed in the array direction.

The transistor portion may further have gate trench portions inwardly provided from the upper surface of the semiconductor substrate, extending in the extending direction. The gate trench portions may be arrayed in the array direction at a trench pitch different from a predetermined trench pitch.

When the semiconductor substrate is seen from above, the distance in the extending direction between an end of the gate trench portion on the diode portion side and an end of the first dummy trench portion in the diode portion may be no greater than twice a trench pitch in the array direction between the gate trench portion in the transistor portion and the first dummy trench portion adjacent to the gate trench portion.

The transistor portion may have a plurality of emitter regions that are in direct contact with the gate trench portions and arrayed in the extending direction on the upper surface of the semiconductor substrate. When the semiconductor substrate is seen from above, the distance in the extending direction between an end of the gate trench portion on the diode portion side and the emitter region provided on the side closest to the diode portion in the transistor portion may be smaller than the distance in the extending direction between an end opposite to the end on the diode portion side of the gate trench portion and the emitter region provided farthest from the diode portion in the extending direction.

The transistor portion may have a collector region on the lower surface of the semiconductor substrate. When the semiconductor substrate is seen from above, a boundary between the cathode region and the collector region may be positioned closer to the transistor portion side relative to a midpoint in the extending direction between the end of the gate trench portion on the diode portion side and the end of the first dummy trench portion in the diode portion. When the semiconductor substrate is seen from above, the boundary between the cathode region and the collector region may be positioned on a side closer to the diode portion relative to the midpoint in the extending direction between the end of the gate trench portion on the diode portion side and the end of the first dummy trench portion in the diode portion.

In the diode portion, first dummy trench portions adjacent to each other in the array direction may have a trench pitch smaller than half the predetermined trench pitch. In the diode portion, the first dummy trench portions adjacent to each other in the array direction may have a trench pitch larger than half the predetermined trench pitch.

The first dummy trench portion may have a U shape in the diode portion when the semiconductor substrate is seen from above. The first dummy trench portion may have a unicursal shape in the diode portion when the semiconductor substrate is seen from above.

Note that, the summary clause does not describe all necessary features of the embodiments of the present invention. The present invention may also be a sub-combination of the features described above.

BRIEF DESCRIPTION OF THE DRAWINGS

FIG. 3b is an enlarged view of the region A2 in FIG. 3a.

DESCRIPTION OF EXEMPLARY EMBODIMENTS

Hereinafter, the present invention will be described through embodiments of the invention. However, the following embodiments shall not limit the claimed invention. Also, not all combinations of features described in the embodiments are essential for means to solve problems provided by aspects of the invention.

In the present specification, one side is referred to as "upper" and the other side is referred to as "lower" in a direction parallel to the depth direction of a semiconductor substrate. Between two principal surfaces of a substrate, a layer, or another member, one surface is referred to as the upper surface and the other surface is referred to as the lower surface. The "upper" and the "lower" directions are not limited by the direction of gravity or the direction of attachment to a substrate or the like at the time of implementation of a semiconductor device.

In the present specification, technical matters may be described using orthogonal coordinate axes of X axis, Y axis and Z axis. In the present specification, a surface parallel to the upper surface of a semiconductor substrate is defined as an XY surface, and the depth direction of the semiconductor substrate is defined as the Z axis.

Each example shows an example in which a first conductivity type is N type and a second conductivity type is P type. However, in other examples, the first conductivity type may be P type and the second conductivity type may be N type. In this case, the conductivity type of a substrate, layer, region and the like in each example will have the opposite polarity, respectively.

Figure 1:
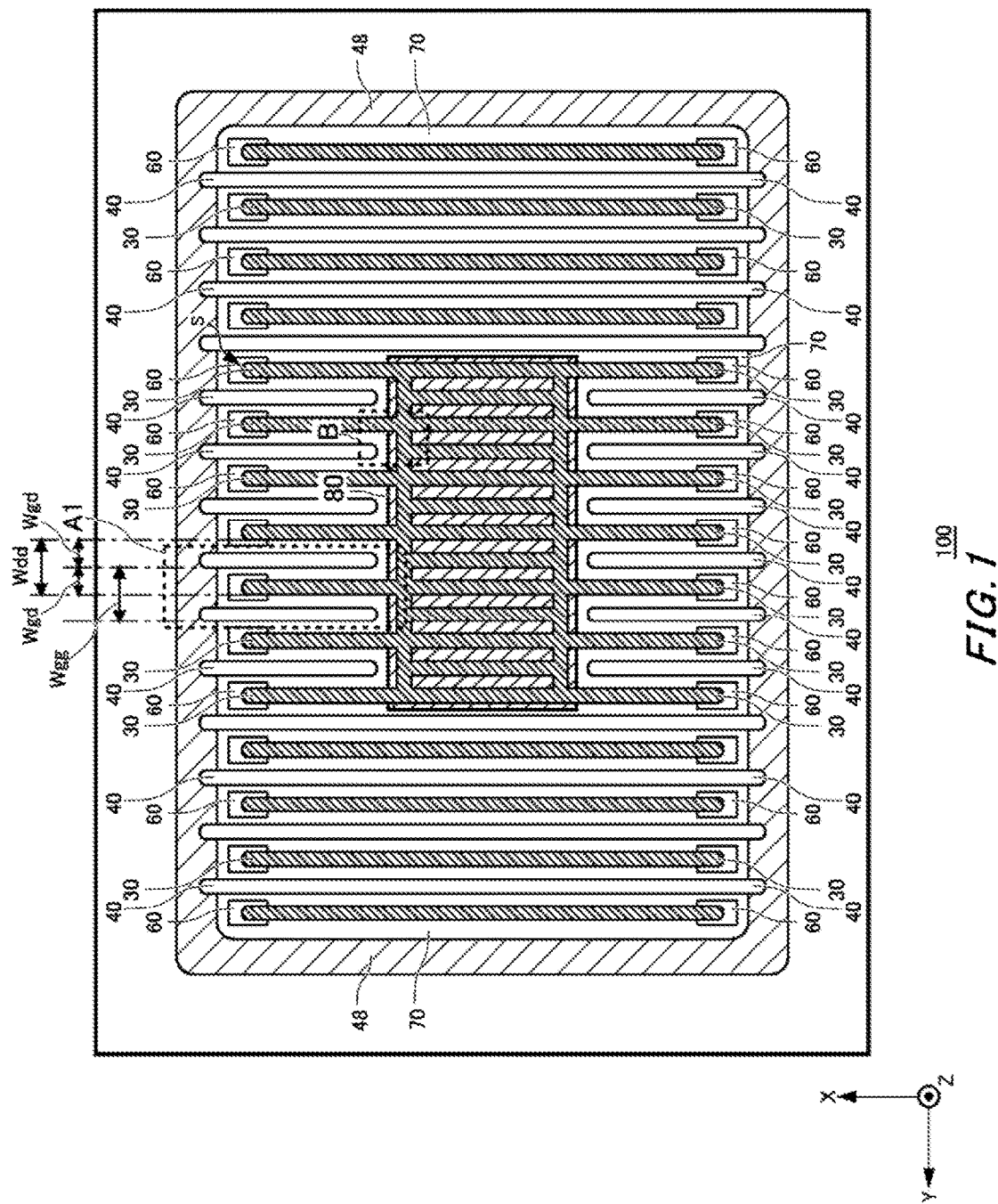
FIG. 1 illustrates one example of the upper surface of a semiconductor device 100 according to the present embodiment.

FIG. 1 illustrates one example of the upper surface (the top view) of a semiconductor device 100 according to the present embodiment. The semiconductor device 100 of the present example is a semiconductor chip including transistor portions 70 and a diode portion 80. The transistor portions 70 include transistors such as IGBTs. The diode portion 80 includes a diode such as a FWD (Free Wheel Diode) on the upper surface of a semiconductor substrate. In one example, the semiconductor device of the present example is provided such that the diode portion 80 is surrounded by the transistor portions 70 when the semiconductor substrate is seen from above.

A cathode region of the first conductivity type is provided on the lower surface of the semiconductor substrate. The cathode region is described in detail in FIG. 4 that follows. The cathode region of the present example is of N+ type. The diode portion 80 is a region of the upper surface of the semiconductor substrate on which the cathode region is projected.

As shown in FIG. 1, one part of a first dummy trench portion 30 is provided inside the diode portion 80, and the other part is provided outside the diode portion 80. Also, the first dummy trench portion 30 is provided extending in series in a predetermined extending direction (the X axis direction in the present example) from inside the diode portion 80 to outside the diode portion 80 on the upper surface of the semiconductor substrate. The extending direction refers to the longitudinal direction of the first dummy trench portion 30 when the semiconductor substrate is seen from above. Also, in the first dummy trench portion 30, a trench is provided at predetermined width and depth from the upper surface of the semiconductor substrate toward the lower surface of the semiconductor substrate (the Z axis direction in the present example).

The first dummy trench portion 30 may be formed integrally from inside the diode portion 80 to outside the diode portion 80. Also, as shown in FIG. 1, the first dummy trench portions 30 may be formed integrally in a grid form in the diode portion 80.

As shown in FIG. 1, a first lead-out portion 60 is provided on the upper surface of the semiconductor substrate, which is electrically connected to the first dummy trench portion 30 outside the diode portion 80. In the present example, as an example an end S of the first dummy trench portion 30 is electrically connected to the first lead-out portion 60 provided in the transistor portion 70. The first lead-out portion 60 is formed of polysilicon in one example. The first lead-out portion 60 is connected to a dummy conductive portion provided in the first dummy trench portion 30 via a dummy insulating film. The dummy conductive portion is formed of polysilicon in one example.

As shown in FIG. 1, the semiconductor device 100 of the present example may further include transistor portions 70 adjacent to the diode portion 80 in the extending direction. In the present example, as an example, the diode portion 80 is provided, surrounded by the transistor portions 70 when the semiconductor substrate is seen from above.

The transistor portions 70 may have the first dummy trench portions 30 extending from the diode portion 80. Also, in the diode portion 80 and the transistor portions 70, the first dummy trench portions 30 may be arrayed at a predetermined trench pitch Wdd in the array direction orthogonal to the extending direction of the first dummy trench portions 30 (the Y axis direction in the present example).

The transistor portions 70 further have gate trench portions 40 extending in the extending direction and provided at predetermined width and depth from the upper surface of the semiconductor substrate toward the lower surface of the semiconductor substrate. The gate trench portions 40 internally have gate conductive portions via gate insulating films. The gate conductive portions are formed of polysilicon in one example.

The longitudinal directions of the first dummy trench portions 30 and the gate trench portions 40 may be parallel in the extending directions. Note that, the array direction may be lateral directions of the first dummy trench portion 30 and the gate trench portion 40 (a width direction of a trench).

In transistor portions 70 adjacent to the diode portion 80 in the extending direction, a gate conductive portion provided at one end of a gate trench portion 40 on a gate ring 48 side is electrically connected to the gate ring 48. Also, in the transistor portions 70 adjacent to the diode portion 80 in the extending direction, the other end of the gate trench portion 40, on a diode portion 80 side does not contact the diode portion 80.

Gate trench portions 40 may be arrayed in the array direction at a trench pitch Wgg. The pitch Wgg may be equal to the pitch Wdd. Also, a gate trench portion 40 and the first dummy trench portion 30 adjacent to the gate trench portion 40 may be arrayed in the array direction at a trench pitch Wgd. The pitch Wgd may be half the pitch Wgg.

Note that, in the transistor portions 70 adjacent to the diode portion 80 in the array direction, a gate trench portion 40 may be provided in series from a side of the gate ring 48 on the +X axis direction side to a side of the gate ring 48 on the −X axis direction side. A gate conductive portion provided at one end of the gate trench portion 40 may be electrically connected to the side of the gate ring 48 on the +X axis direction side. Also, a gate conductive portion provided on the other end of the gate trench portion 40 may be electrically connected to the side of the gate ring 48 on the −X axis direction side.

Also, in the transistor portions 70 adjacent to the diode portion 80 in the array direction, the first dummy trench portion 30 may be provided in series from the first lead-out portion 60 that is adjacent to the side of the gate ring 48 on the +X axis direction side to the first lead-out portion 60 that is adjacent to the side of the gate ring 48 on the −X axis direction side. A dummy conductive portion provided at one end of the first dummy trench portion 30 may be electrically connected to the first lead-out portion 60 that is adjacent to the side of the gate ring 48 on the +X axis direction side. Also, a dummy conductive portion provided on the other end of the first dummy trench portion 30 may be electrically connected to the first lead-out portion 60 that is adjacent to the side of the gate ring 48 on the −X axis direction side.

Figure 2A:
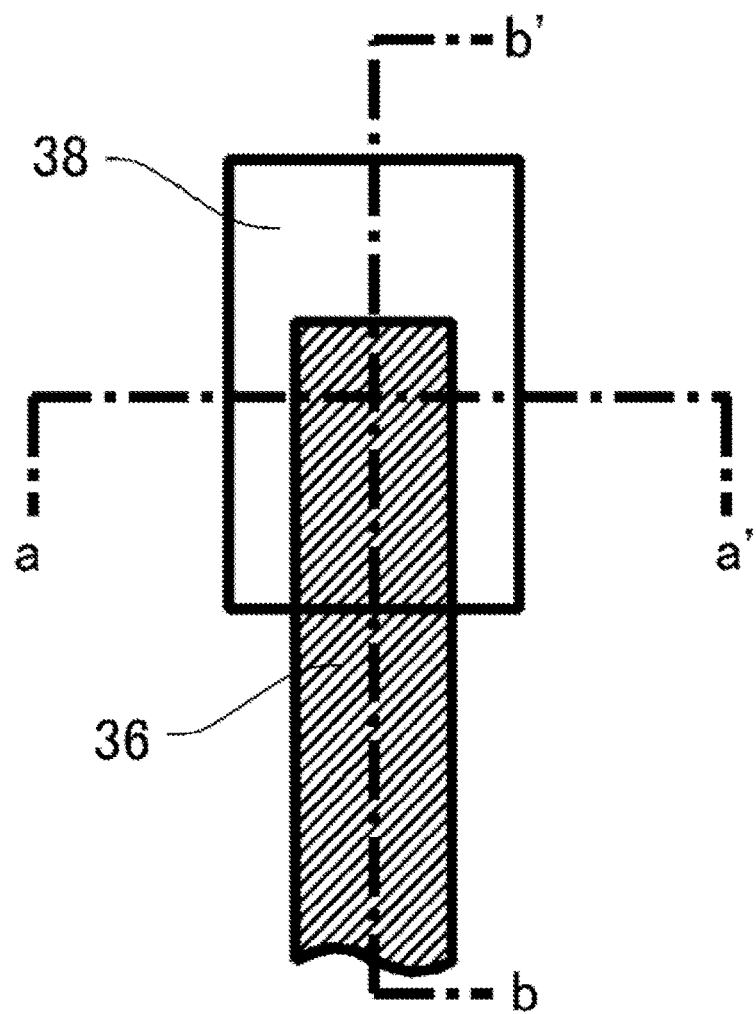
FIG. 2a illustrates one example of the top view of a mask layout for a first lead-out portion 60.

FIG. 2a illustrates one example of the top view of a mask layout to form the first lead-out portion 60. As shown in FIG. 2a, the mask layout of the present example has a polysilicon pattern 38 corresponding to the first lead-out portion 60, and a trench pattern 36 corresponding to the first dummy trench portion 30.

Figure 2B:
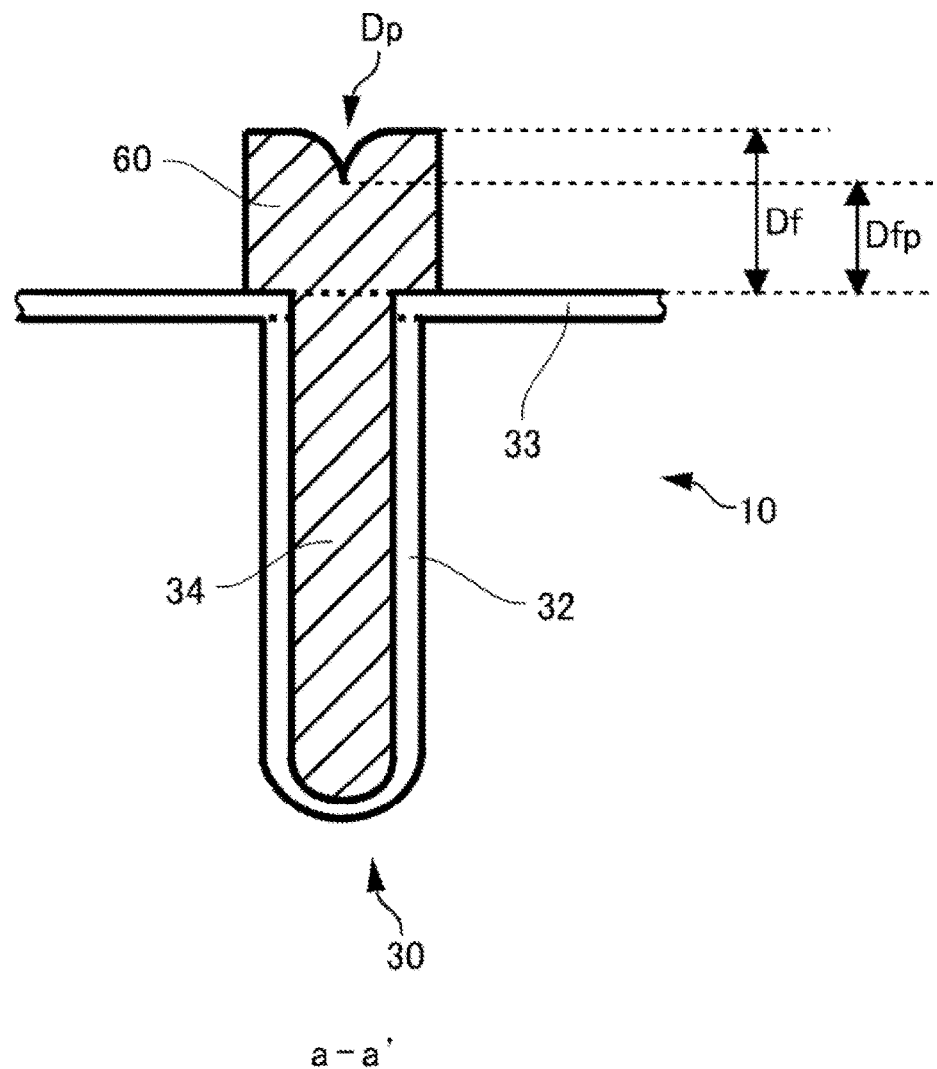
FIG. 2b illustrates one example of the cross-section a-a' of the first lead-out portion 60 produced by the mask layout of FIG. 2a and a first dummy trench portion 30.
Figure 2B:
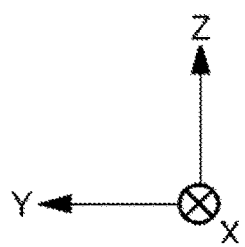

FIG. 2b illustrates one example of the cross-section a-a' of the first lead-out portion 60 produced by the mask layout of FIG. 2a and the first dummy trench portion 30. As shown in FIG. 2b, the first lead-out portion 60 of the present example is formed protruding above the first dummy trench portion 30. Thus, a level difference Df is formed between the upper surface of the first lead-out portion 60 and an insulating film 33 that is formed on the upper surface of a semiconductor substrate 10. The insulating film 33 may be an oxide film formed by oxidizing the upper surface of the semiconductor substrate 10.

The first dummy trench portion 30 has a dummy trench, a dummy insulating film 32, and a dummy conductive portion 34 which are formed on the upper surface side of the semiconductor substrate 10. The dummy insulating film 32 is formed covering the inner walls of the dummy trench. The dummy conductive portion 34 is formed inside the dummy trench, and on an inner side relative to the dummy insulating film 32. The dummy insulating film 32 insulates the dummy conductive portion 34 from the semiconductor substrate 10. The dummy conductive portion 34 is formed of a conductive material such as polysilicon in one example.

Note that, a recess Dp is formed in the middle of the first lead-out portion 60 in the Y axis direction, which is caused by filling the dummy trench with polysilicon. A distance Dfp is a distance from the insulating film 33 formed on the upper surface of the semiconductor substrate 10 to the bottom of the recess Dp.

Figure 2C:
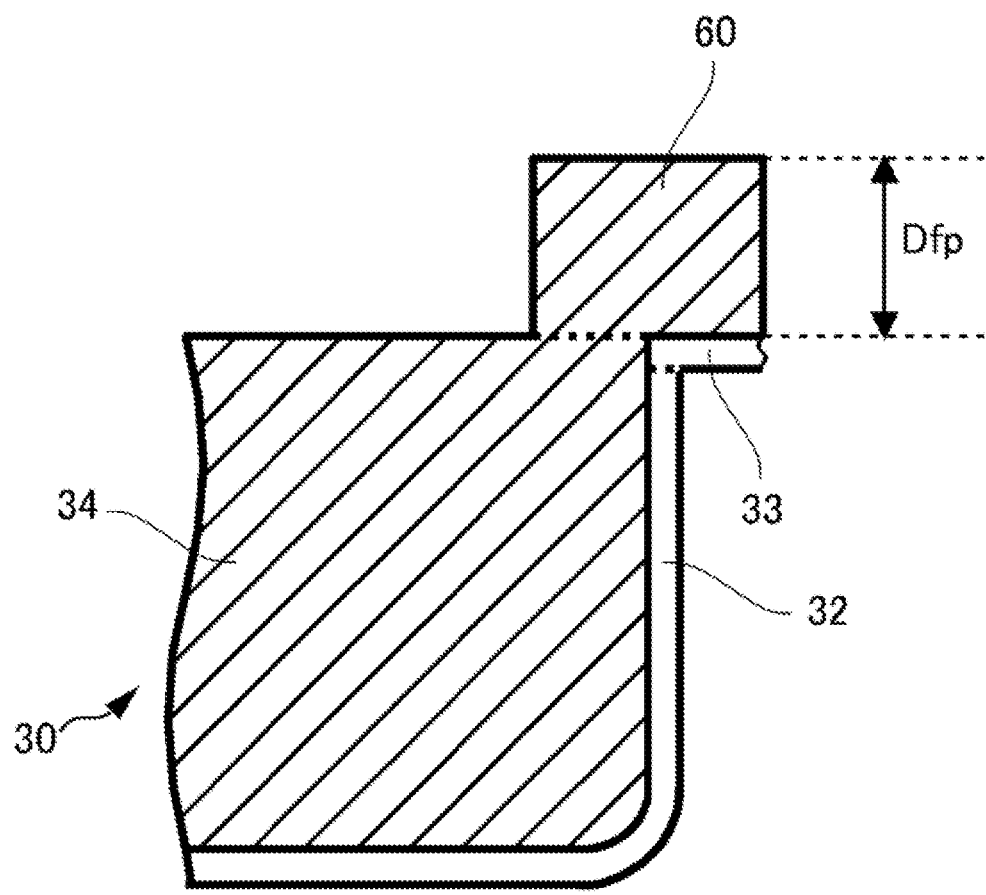
FIG. 2c illustrates one example of the cross-section b-b' of the first lead-out portion 60 produced by the mask layout of FIG. 2a and the first dummy trench portion 30.
Figure 2C:
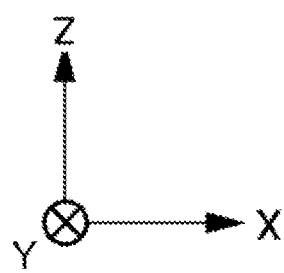

FIG. 2c illustrates one example of the cross-section b-b' of the first lead-out portion 60 produced by the mask layout of FIG. 2a and the first dummy trench portion 30. As shown in FIG. 2c, the first lead-out portion 60 of the present example is formed protruding above the first dummy trench portion 30. Note that, in the cross-section b-b', the first lead-out portion 60 protrudes by a distance Dfp above the first dummy trench portion 30. Note that, there may not be an insulating film 33 under the first lead-out portion 60.

In the semiconductor device 100 of the present example, the first dummy trench portion 30 in the diode portion 80 is provided extending to the transistor portion 70 outside the diode portion 80. Thus, electrical connection can be externally led out from the first dummy trench portion 30 without forming the first lead-out portion 60 for the first dummy trench portion 30 near the center of the semiconductor device 100 where the diode portion 80 is arranged. Thus, there is no need to provide the first lead-out portion 60 having a level difference Df near the center of the semiconductor substrate 10. Thus, trouble such as cracks in the semiconductor substrate 10, which is prone to occur if wire bonding is performed to the first lead-out portion 60, is unlikely to occur.

Also, in the semiconductor device 100 of the present example, the first dummy trench portion 30 in the diode portion 80 is provided extending to the transistor portion 70 outside the diode portion 80, and electrically connected to the first lead-out portion 60 outside the diode portion 80. Thus, there is no need to provide a contact hole on an interlayer dielectric film formed above the first dummy trench portion 30 to make contact with the first dummy trench portion 30 from above the semiconductor substrate 10 through the contact hole. Thus, if a trench width of the first dummy trench portion 30 is narrow, a fine process of making contact by forming the contact hole on an interlayer dielectric film (not shown) formed at the upper part of the first dummy trench portion 30 is not required. Also, if the trench width of the first dummy trench portion 30 is wide, a level difference to occur at the upper surface of the first dummy trench portion 30 due to thick polysilicon being embedded in a trench can be increased. If the difference is increased, difficulty in the process of making contact by forming the contact hole on the interlayer dielectric film (not shown) formed at the upper part of the first dummy trench portion 30 is increased. In the semiconductor device 100 of the present example, because a contact hole is not formed on the interlayer dielectric film formed at the upper part of the first dummy trench portion 30, the increase in difficulty in the process can be avoided. Note that, in FIG. 1, the interlayer dielectric film and the contact hole are omitted.

Figure 2D:
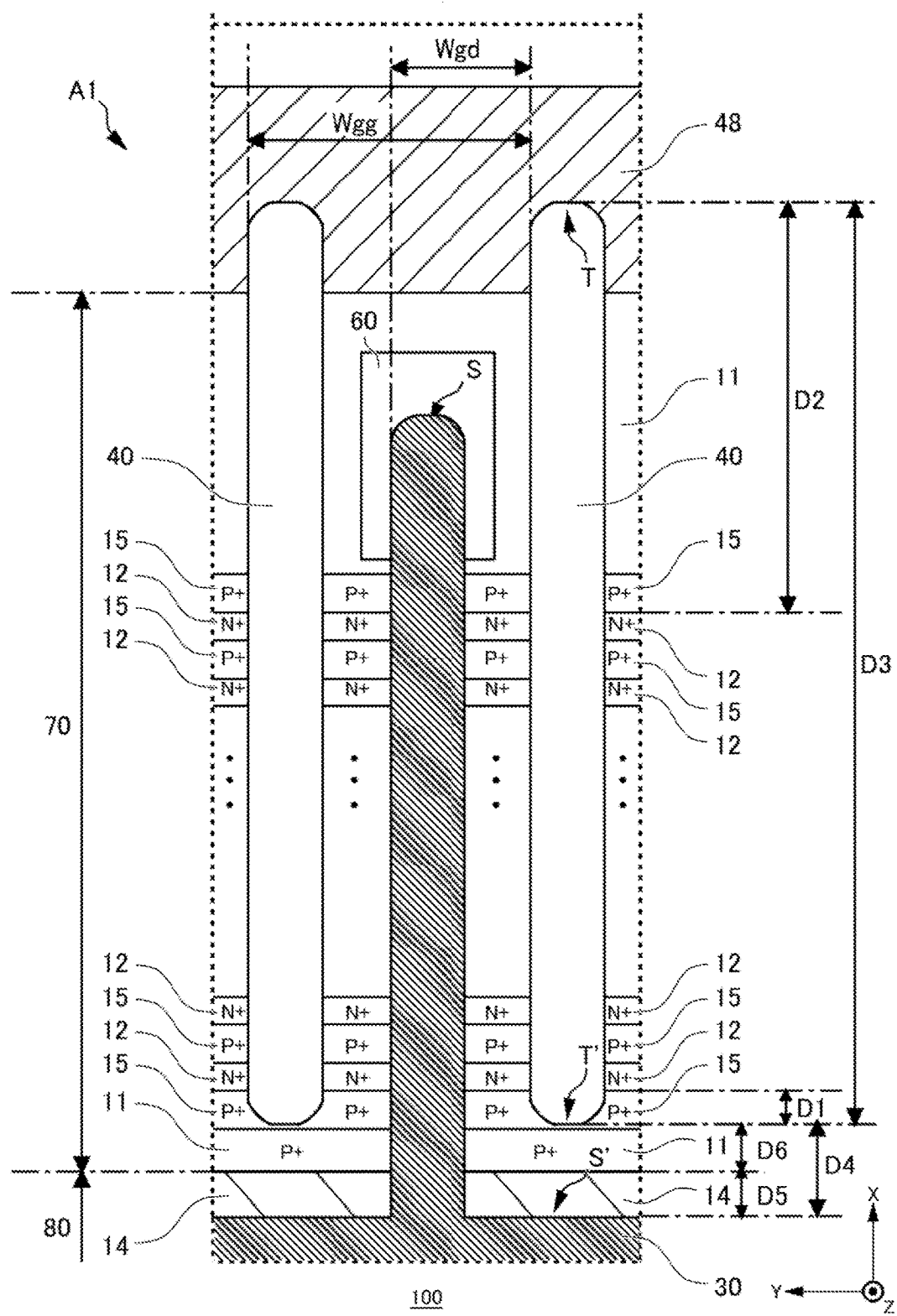
FIG. 2d is an enlarged view of the region A1 in FIG. 1.

FIG. 2d is an enlarged view of the region A1 in FIG. 1. As shown in FIG. 2d, the transistor portion 70 has a well region 11 in a region adjacent to a gate ring 48. The well region 11 of the present example is of P+ type, for example. A dummy conductive portion 34 provided at an end S of the first dummy trench portion 30 is electrically connected to the well region 11 formed on a surface layer of the semiconductor substrate 10 through the first lead-out portion 60.

In the present example, the end S is an end on the most positive side in the X axis direction of the first dummy trench portion 30. An end S' is an end of the first dummy trench portion 30 in the diode portion 80, which is on the most positive side in the X axis direction. Also, an end T is an end of a gate trench portion 40, which is on the most positive side in the X axis direction. An end T' is an end of the gate trench portion 40, which is on the most negative side in the X axis direction.

The transistor portion 70 has contact regions 15 on the −X axis direction side of the well region 11 such that they are adjacent to the well region 11. The contact regions 15 of the present example are of P+ type, for example. Also, the transistor portion 70 has emitter regions 12 in the extending direction such that they are adjacent to the contact regions 15. The emitter regions 12 of the present example are of N+ type, for example. The emitter regions 12 are provided on the upper surface of the semiconductor substrate 10 so as to contact gate trench portions 40. As shown in FIG. 2d, the emitter regions 12 and the contact regions 15 may be adjacent to each other and provided alternately in the X axis direction down to the −X axis direction side relative to the end T' of the gate trench portions 40.

A distance D1 is a distance between an end T' of a gate trench portion 40 and an end on the −X axis side of an emitter region 12 provided on the most negative side in the X axis direction. A distance D2 is a distance between an end T of the gate trench portion 40 and an end on the +X axis side of an emitter region 12 provided on the most positive side in the X axis direction. The distance D1 may be smaller than the distance D2. The distance D2 may be in the range of from 10 to 50 times inclusive of the distance D1. The distance D1 is 0.5 μm in one example. The distance D2 is 20 μm in one example.

A distance D4 is a distance between an end T' of a gate trench portion 40 and an end S' of the first dummy trench portion 30. A pitch Wgd is a pitch from the first dummy trench portion 30 to an adjacent gate trench portion 40. The distance D4 may be smaller than the pitch Wgd. The pitch Wgd may be no greater than twice the distance D4. A length D3 of a gate trench portion 40 may be 1 mm or less. A distance D5 is a distance from an end S' to the boundary between the diode portion 80 and the transistor portion 70, which is a boundary parallel to the Y axis direction. The distance D5 may be half the distance D4. Also, a distance D6 is a distance from an end T' to the boundary between the diode portion 80 and the transistor portion 70, which is parallel to the Y axis direction. The distance D6 may be half the distance D4. That is, it may be D5=D6=(½)D4.

The distance D5 and the distance D6 may have a relation of D5>D6. That is, the boundary between the diode portion 80 and the transistor portion 70, which is a boundary parallel to the Y axis direction, may be positioned on the side close to the transistor portion 70 relative to the midpoint between the end S' and the end T' in the X axis direction. That is, a boundary between a well region 11 and a base region 14 may be positioned on the side closer to the transistor portion 70. By providing the boundary between the well region 11 and the base region 14 on the side closer to the transistor portion 70, it is possible to preferentially adjust a characteristic of the diode portion 80 such as withstand voltage.

A well region 11 and a base region 14 that is described below may have substantially the same impurity concentration and depth. By making the well region 11 and the base region 14 have substantially the same impurity concentration and depth, a process can be omitted and thus the cost can be reduced.

The distance D5 and the distance D6 may have a relation of D5<D6. That is, the boundary between the diode portion 80 and the transistor portion 70, which is a boundary parallel to the Y axis direction, may be positioned on the side close to the diode portion 80 relative to the midpoint between the end S' and the end T' in the X axis direction. By making the boundary position on the side close to the diode portion 80 relative to the midpoint between the end S' and the end T' in the X axis direction, it is possible to preferentially adjust a characteristic of the transistor portion 70 such as withstand voltage.

Figure 3A:
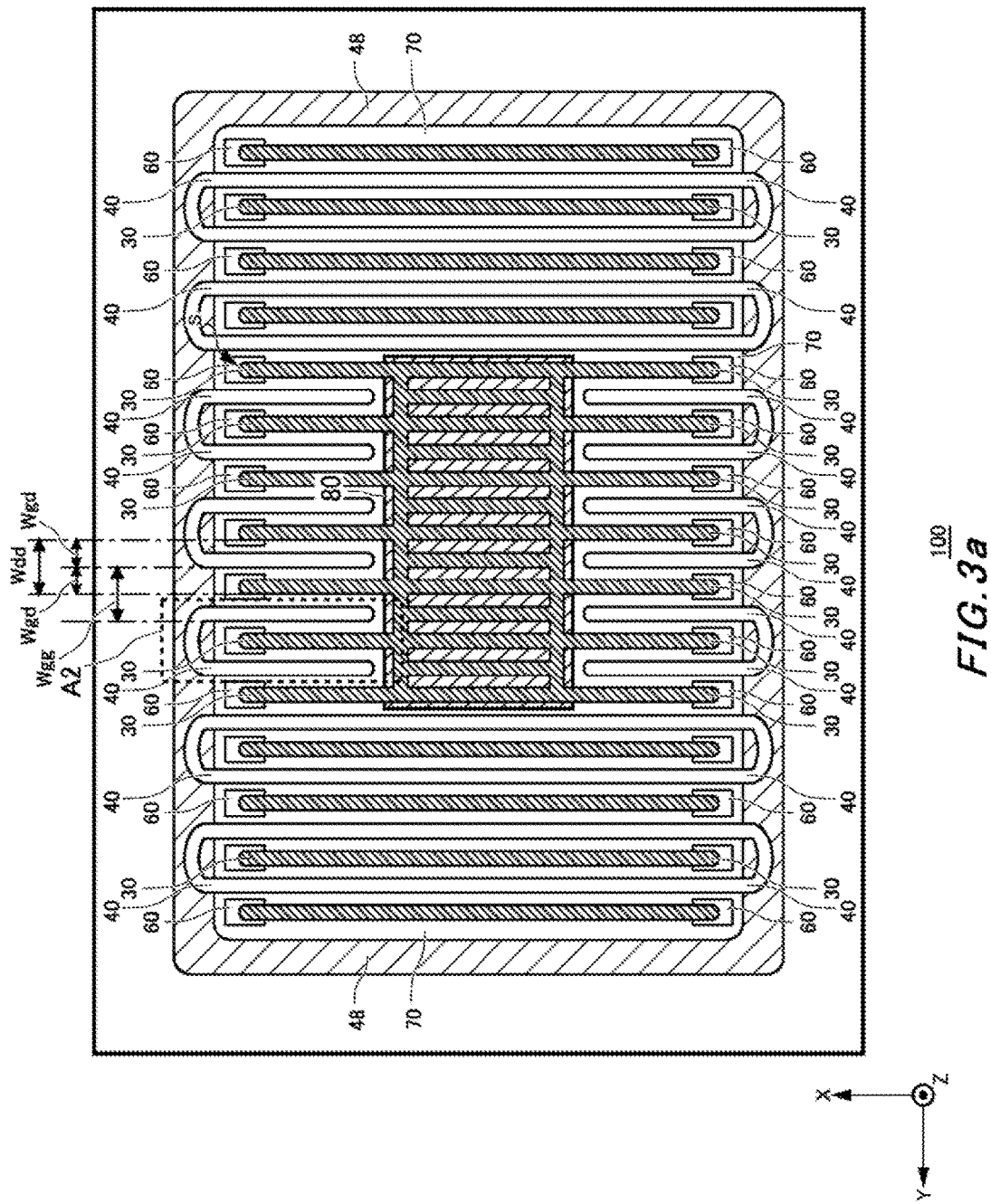
FIG. 3a illustrates another example of the upper surface of a semiconductor device 100 according to the present embodiment.

FIG. 3a illustrates another example of the upper surface of a semiconductor device 100 according to the present embodiment. The semiconductor device 100 shown in FIG. 3a is different from the semiconductor device 100 shown in FIG. 1 in that ends of gate trench portions 40 provided in transistor portions 70 are connected in a U shape. When a semiconductor substrate is seen from above, in transistor portions 70 on the +X axis direction side and the −X axis direction side of the diode portion 80, ends of pairs of gate trench portions 40, which overlap a gate ring 48 may be connected in a U shape. Ends of the gate trench portions 40 on the diode portion 80 side may be terminated ends similar to those in the example of FIG. 1. In the transistor portions 70 on the +Y axis direction side and the −Y axis direction side of the diode portion 80, ends of pairs of gate trench portions 40 in the +X axis direction side and the −X axis direction side may be connected together in U shapes, respectively.

In the semiconductor device 100 of the present example, because ends of pairs of gate trench portions 40 provided in the transistor portion 70 are connected in U shapes, connection area between gate conductive portions in the gate trench portions 40 and the gate ring 48 can be enlarged. Thus, it is possible to further stabilize the gate potential of the transistor portion 70.

Figure 3B:
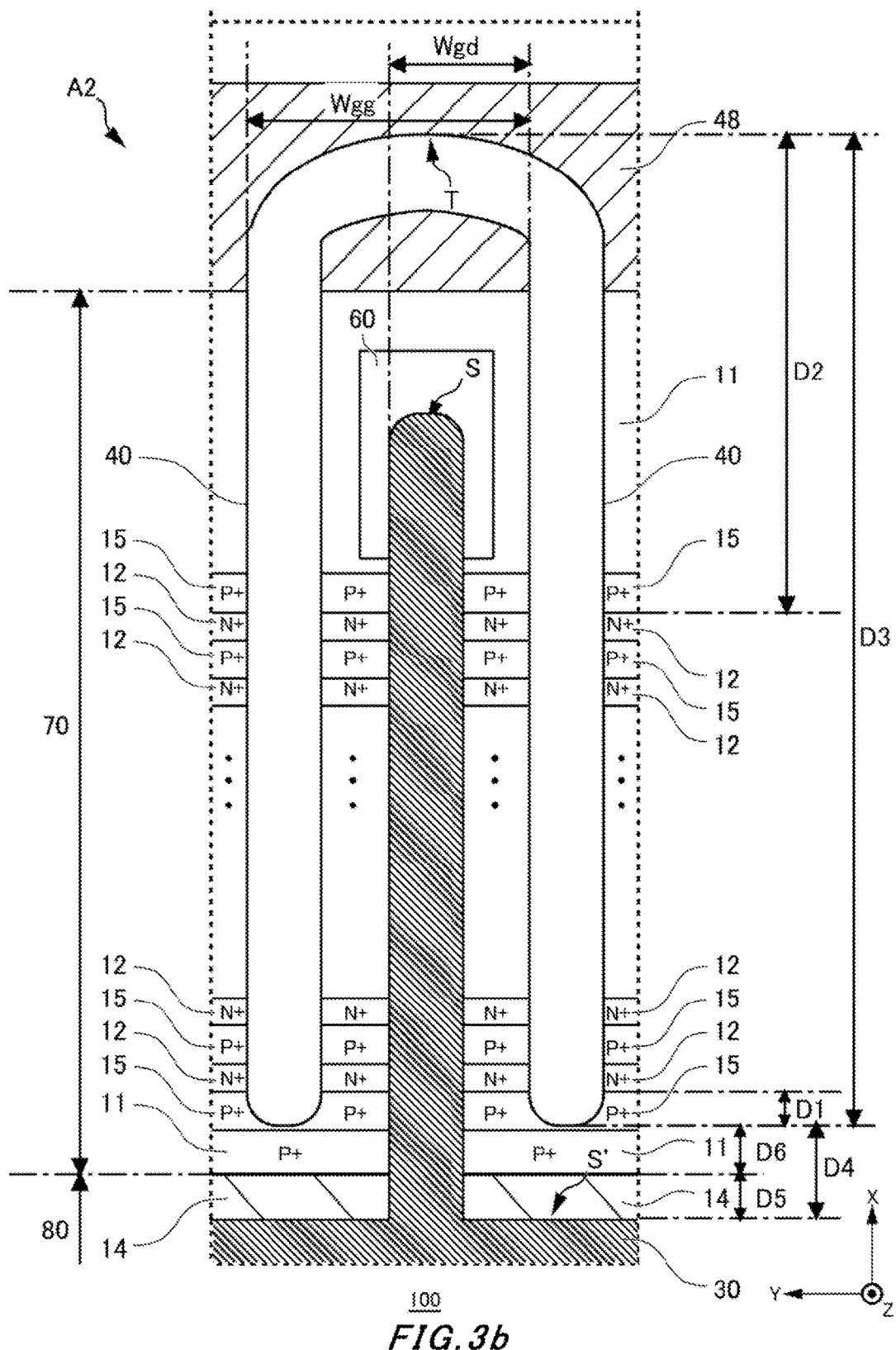

FIG. 3b is one example of an enlarged view of the region A2 in FIG. 3a. As shown in FIG. 3b, in the semiconductor device 100 of the present example, a pair of ends of gate trench portions 40 provided in the transistor portion 70 are connected in a U shape.

In the semiconductor device 100 of the present example, because ends of pairs of gate trench portions 40 provided in the transistor portion 70 are connected in U shapes, connection area between gate conductive portions in the gate trench portions 40 and the gate ring 48 can be enlarged. Thus, it is possible to further stabilize the gate potential of the transistor portion 70.

Figure 4:
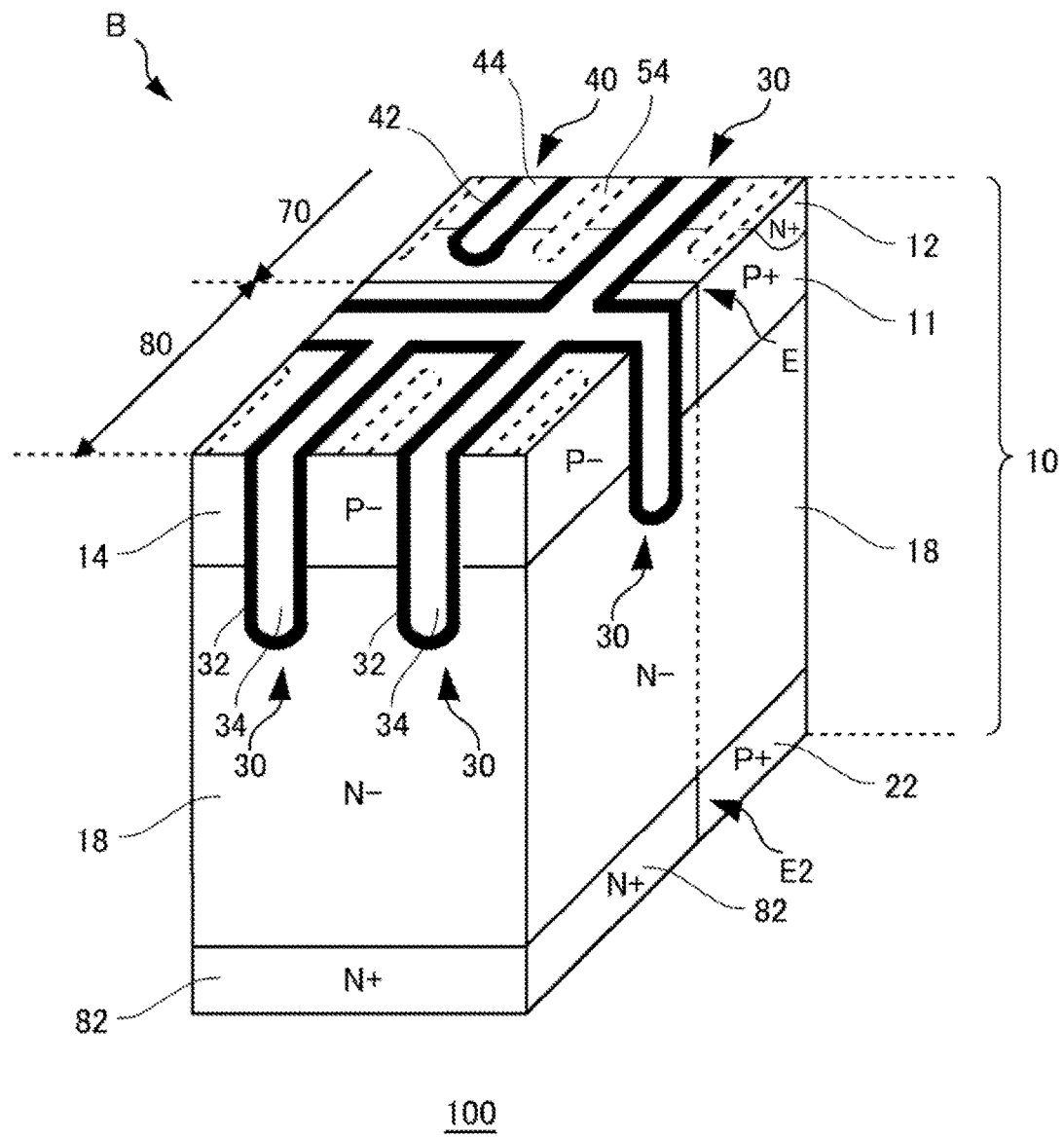
FIG. 4 is a perspective view of the region B in FIG. 1.
Figure 4:
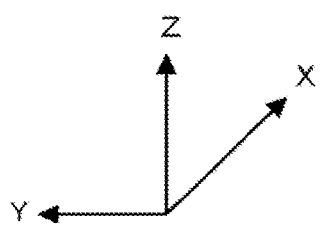

FIG. 4 is a perspective view of the region B in FIG. 1. The semiconductor device 100 of the present example has a semiconductor substrate 10 in the perspective view, as an example. The semiconductor substrate 10 may be a silicon substrate, a silicon carbide substrate, or a nitride semiconductor substrate or the like such as a gallium nitride semiconductor substrate. The semiconductor substrate 10 of the present example is a silicon substrate.

In the perspective view, the transistor portion 70 may include a well region 11 on the upper surface of the semiconductor substrate 10. In the transistor portion 70, an emitter region 12 and a contact region 15 are provided on the surface layer of the well region 11 as an example. A drift region 18 may be provided under the well region 11. A collector region 22 is provided under the drift region 18. The well region 11 is of P+ type, as an example. The drift region 18 is of N− type, as an example. In the perspective view, a base region 14, a drift region 18, and a cathode region 82 are sequentially arranged from the upper surface side of the semiconductor substrate 10 in the diode portion 80 as an example. Note that, the well region 11 and the base region 14 may have substantially the same impurity concentration and depth.

A first dummy trench portions 30 may be provided in both the transistor portion 70 and the diode portion 80 from the upper surface of the semiconductor substrate 10 toward the lower surface of the semiconductor substrate 10, at depth reaching the drift region 18. In the first dummy trench portions 30, dummy insulating films 32 are provided along internal surfaces of trenches. Dummy conductive portions 34 are embedded in the trenches via the dummy insulating films 32. Gate trench portions 40 may be provided in the transistor portion 70 from the upper surface of the semiconductor substrate 10 toward the lower surface of the semiconductor substrate 10, at depth reaching the drift region 18. In the gate trench portions 40, gate insulating films 42 are provided along internal surfaces of trenches. Gate conductive portions 44 are embedded in the trenches via the gate insulating films 42.

In the perspective view, contact holes 54 are provided on an interlayer dielectric film formed on the upper surface of the semiconductor substrate 10. In the perspective view, the interlayer dielectric film is omitted and regions in which the contact holes 54 are provided are shown with the dotted lines.

In the transistor portion 70, the collector region 22 is provided on the lower surface side of the semiconductor substrate 10. Also, in the diode portion 80, the cathode region 82 is provided on the lower surface side of the semiconductor substrate 10. In the perspective view, E represents the boundary between the transistor portion 70 and the diode portion 80 on the upper surface side of the semiconductor substrate 10.

Figure 5A:
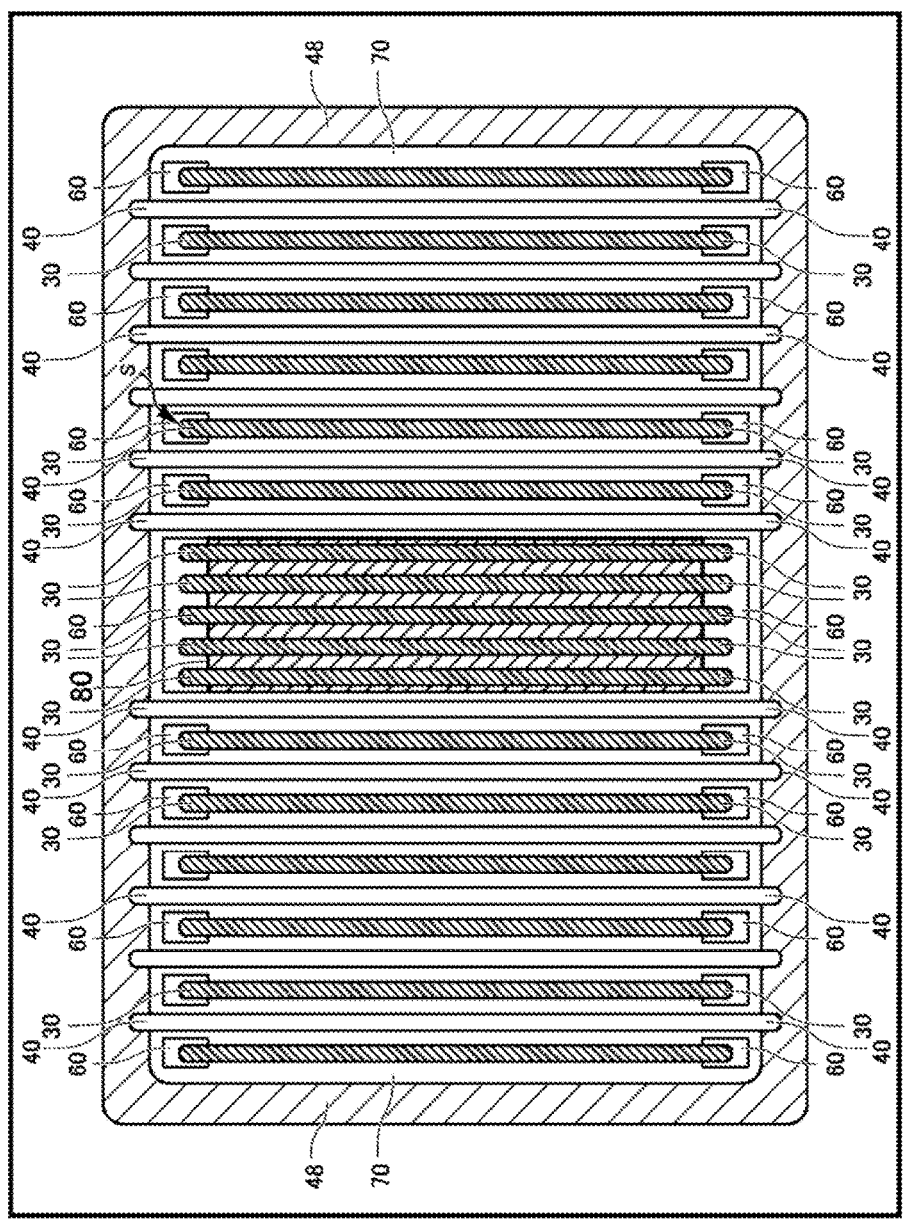
FIG. 5a illustrates the upper surface of a semiconductor device 150 of a first comparative example.

FIG. 5a illustrates the upper surface of a semiconductor device 150 of a first comparative example. The semiconductor device 150 of the first comparative example is not provided with transistor portions 70 on the +X axis direction side and the −X axis direction side of a diode portion 80. A first dummy trench portions 30 of the diode portion 80 are provided in series from a first lead-out portion 60 that is adjacent to a side of a gate ring 48 on the +X axis direction side to the first lead-out portion 60 that is adjacent to a side of the gate ring 48 on the −X axis direction side. The first lead-out portions 60 to which the first dummy trench portions 30 of the diode portion 80 are connected are provided at substantially the same position in the X axis direction as the position of the first lead-out portions 60 to which the first dummy trench portions 30 of the transistor portion 70 are connected.

Because the transistor portion 70 and the diode portion 80 alternately operate, the transistor portion 70 and the diode portion 80 are alternatively heated. Thus, it is desirable to arrange the diode portion 80 to be highly symmetrical about the transistor portion 70. In the semiconductor device 150 of the first comparative example, because transistor portions 70 are not provided on the +X axis direction side and the −X axis direction side of the diode portion 80, the arrangement of the diode portion 80 is low in symmetry about the transistor portion 70, compared with the semiconductor device 100 shown in FIG. 1.

Figure 5B:
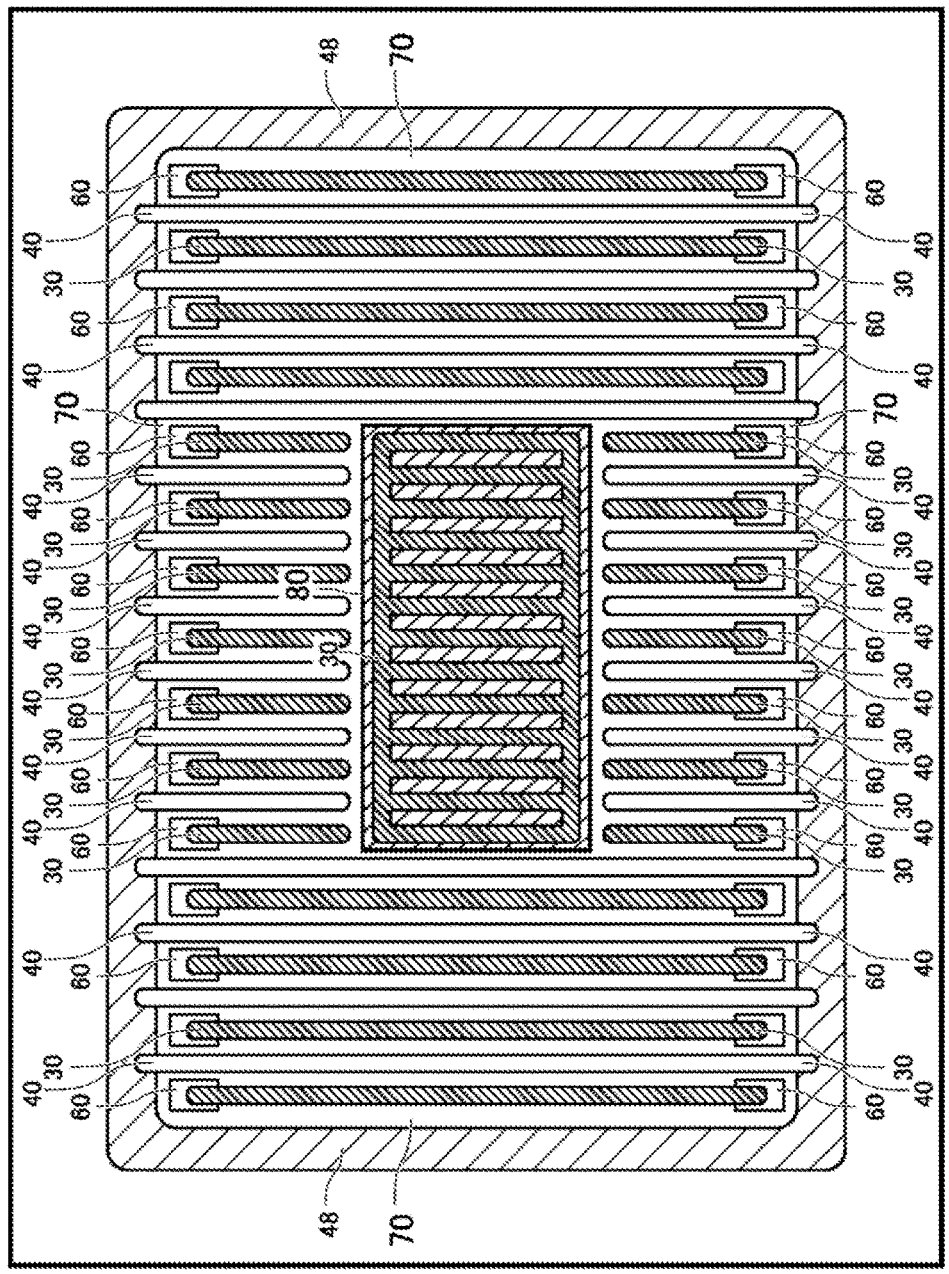
FIG. 5b illustrates the upper surface of a semiconductor device 160 of a second comparative example.

FIG. 5b illustrates the upper surface of a semiconductor device 160 of a second comparative example. The semiconductor device 160 of the second comparative example is different from the semiconductor device 100 of FIG. 1 in that first dummy trench portions 30 formed in a diode portion 80 are not provided outside the diode portion 80. Thus, in order to electrically connect the first dummy trench portions 30 formed in the diode portion 80 and first lead-out portions 60 provided in a transistor portion 70, it is required to either provide the first lead-out portions 60 near the center of a semiconductor device 160 where the diode portion 80 is provided, or make direct contact by forming contact holes on an interlayer dielectric film (not shown) on the upper part of the first dummy trench portions 30.

In a case of providing the first lead-out portions 60 near the center of the semiconductor device 160 where the diode portion 80 is provided, if wire bonding is performed on the first lead-out portion 60, trouble such as a crack is prone to occur due to a level difference Df of the first lead-out portion 60, which is formed near the center of the semiconductor device 160. Also, in a case of making directly contact by forming contact holes on an interlayer dielectric film (not shown) on the upper part of the first dummy trench portion 30, if a trench width of the first dummy trench portion 30 is narrow, a fine process is required. Also, if a trench width of the first dummy trench portion 30 is wide, a level difference Df increases due to thick polysilicon, which results in increase in difficulty in a process.

Figure 6A:
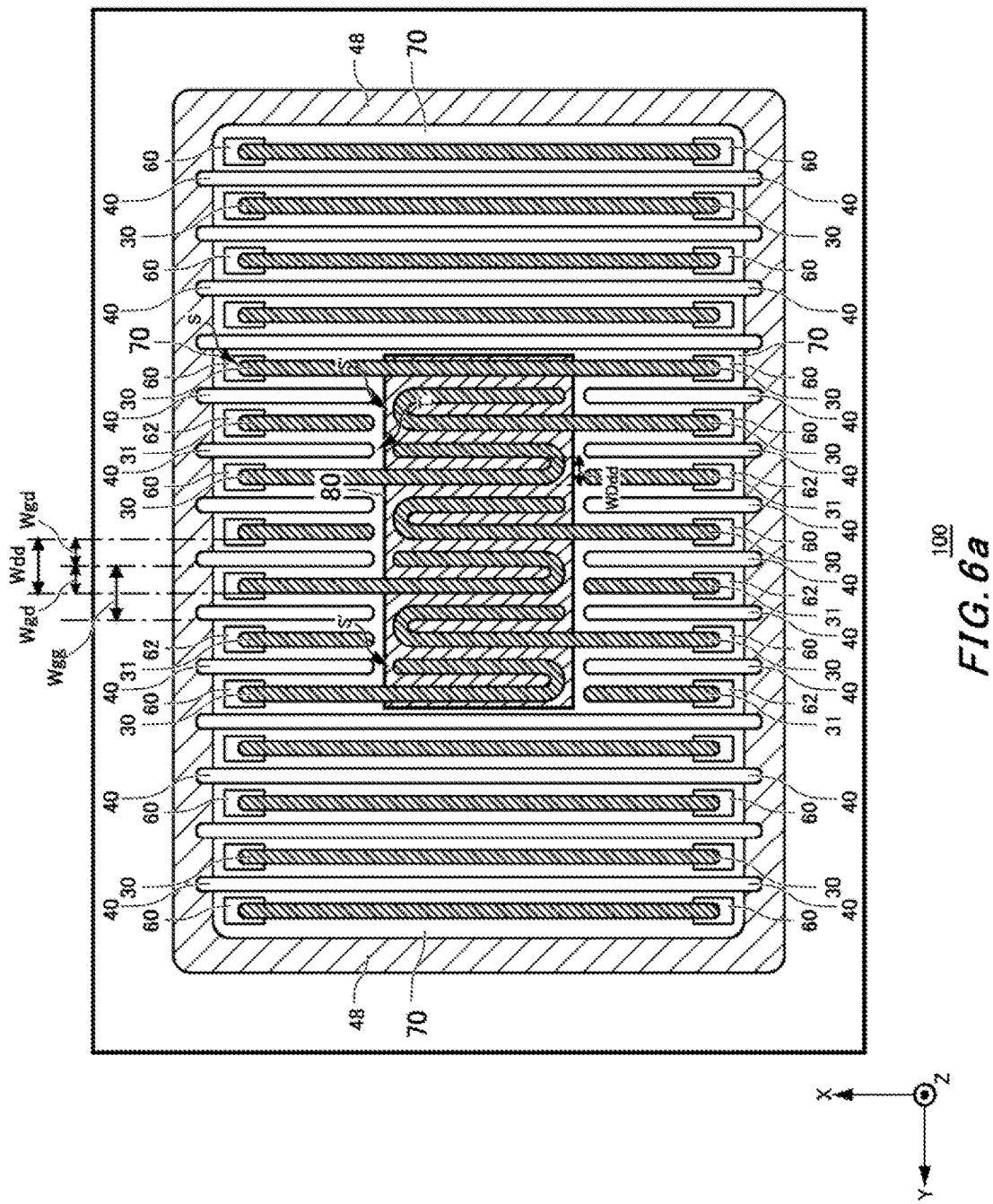
FIG. 6a illustrates another example of the upper surface of a semiconductor device 100 according to the present embodiment.

FIG. 6a illustrates another example of the upper surface of a semiconductor device 100 according to the present embodiment. The semiconductor device 100 of the present example is different from the semiconductor device 100 shown in FIG. 1 in that a first dummy trench portions 30 have U shapes in a diode portion 80. A pair of the first dummy trench portions 30 extending in the extending direction has a U shape. One of the first dummy trench portions 30 constituting the U shape is provided extending outside the diode portion 80 in series in the extending direction. The one of the first dummy trench portions 30 is electrically connected to a first lead-out portion 60 that is provided outside the diode portion 80. The other one of the pair of the first dummy trench portions 30 may terminate in the diode portion 80.

When a semiconductor substrate 10 is seen from above, a plurality of the first dummy trench portions 30 may be provided in the diode portion 80, pairs of which have U shapes and one end of a U shape is provided extending outside the diode portion 80. FIG. 6a shows an example in which each pair of the first dummy trench portions 30 having a U shape is arranged point symmetrically to adjacent pair. Note that, an end S' is an end of a U shape of the first dummy trench portion 30, which is on the most positive side in the X axis direction. Also, an end S' is an end of the first dummy trench portion 30, which terminates in the diode portion 80 and is on the most positive side in the X axis direction.

As shown in FIG. 6a, in transistor portions 70 adjacent to the diode portion 80 in the extending direction, a second dummy trench portions 31 may be provided, ends of which terminate in the transistor portion 70. Similar to the first dummy trench portion 30, the second dummy trench portion 31 is provided with a dummy conductive portion 34 via a dummy insulating film 32. The second dummy trench portion 31 may be provided at substantially the same position as the first dummy trench portion 30 in the Y axis direction, the first dummy trench portion 30 is the one extending outside the diode portion 80 among a pair of first dummy trench portions 30 extending in the extending direction and having a U shape.

A pitch WDdd is a pitch of a pair of the first dummy trench portions 30 having a U shape and extending in the extending direction, in the Y axis direction. A pitch Wgd is a pitch from the first dummy trench portion 30 to a gate trench portion 40 in the transistor portion 70. The pitch WDdd may be equal to the pitch Wgd. FIG. 6a shows an example in which the pitch WDdd is equal to the pitch Wgd. Note that, an end T' is an end of a gate trench portion 40, which is on the most negative side in the X axis direction.

As shown in FIG. 6a, a second lead-out portion 62 is provided on the upper surface of the semiconductor substrate 10, which is electrically connected to the second dummy trench portion 31 outside the diode portion 80. The second lead-out portion 62 is formed of polysilicon in one example. The second lead-out portion 62 is connected to a dummy conductive portion 34 in the second dummy trench portion 31. The dummy conductive portion 34 is formed of polysilicon in one example.

As shown in FIG. 6a, the first lead-out portions 60 and the second lead-out portions 62 may be arrayed in the array direction. The first lead-out portion 60 and the second lead-out portion 62 may be adjacently provided on the +X axis direction side and the −X axis direction side of a gate ring 48. The first lead-out portion 60 and the second lead-out portion 62 adjacent to each other on the +X axis direction side of the gate ring 48 may be arranged at substantially the same position in the X axis direction. The first lead-out portion 60 and the second lead-out portion 62 adjacent to each other on the −X axis direction side of the gate ring 48 may be arranged at substantially the same position in the X axis direction.

In the semiconductor device 100 of the present example, the first dummy trench portion 30 in the diode portion 80 is provided extending to the transistor portion 70 outside the diode portion 80. Thus, similar to the semiconductor device 100 shown in FIG. 1, there is no need to provide the first lead-out portion 60 having a level difference Df, near the center of the semiconductor substrate 10. Thus, trouble such as cracks in the semiconductor substrate 10, which is prone to occur if wire bonding is performed to the first lead-out portion 60, is unlikely to occur.

Also, in the semiconductor device 100 of the present example, the first dummy trench portion 30 in the diode portion 80 is provided extending to the transistor portion 70 outside the diode portion 80, and electrically connected to the first lead-out portion 60 outside the diode portion 80. Thus, similar to the semiconductor device 100 shown in FIG. 1, if a trench width of the first dummy trench portion 30 is narrow, a fine process of making contact by forming a contact hole on an interlayer dielectric film (not shown) formed at the upper part of the first dummy trench portion 30 is not required. Also, if the trench width of the first dummy trench portion 30 is wide, a level difference to occur at the upper surface of the first dummy trench portion 30 due to thick polysilicon being embedded in a trench can be increased. If the difference is increased, difficulty in the process of making contact with the first dummy trench portion 30 is increased. In the semiconductor device 100 of the present example, the increase in difficulty in the process can be avoided.

Also, because the semiconductor device 100 of the present example has the first dummy trench portions 30 having U shapes, and does not have trenches intersecting each other in T shapes or cross shapes shown in the semiconductor device 100 in FIG. 1, enlargement of trench widths that is prone to occur at the intersection parts does not occur. That is, the semiconductor device 100 of the present example allows trench widths of the first dummy trench portions 30 to be uniform. Thus, occurrence of a drop region can be suppressed in which the embedded polysilicon drops due to a trench width being enlarged by trenches intersecting each other in a T shape or a cross shape. Thus, the drop region of polysilicon can be prevented from dropping deep relative to a linear trench portion.

Figure 6B:
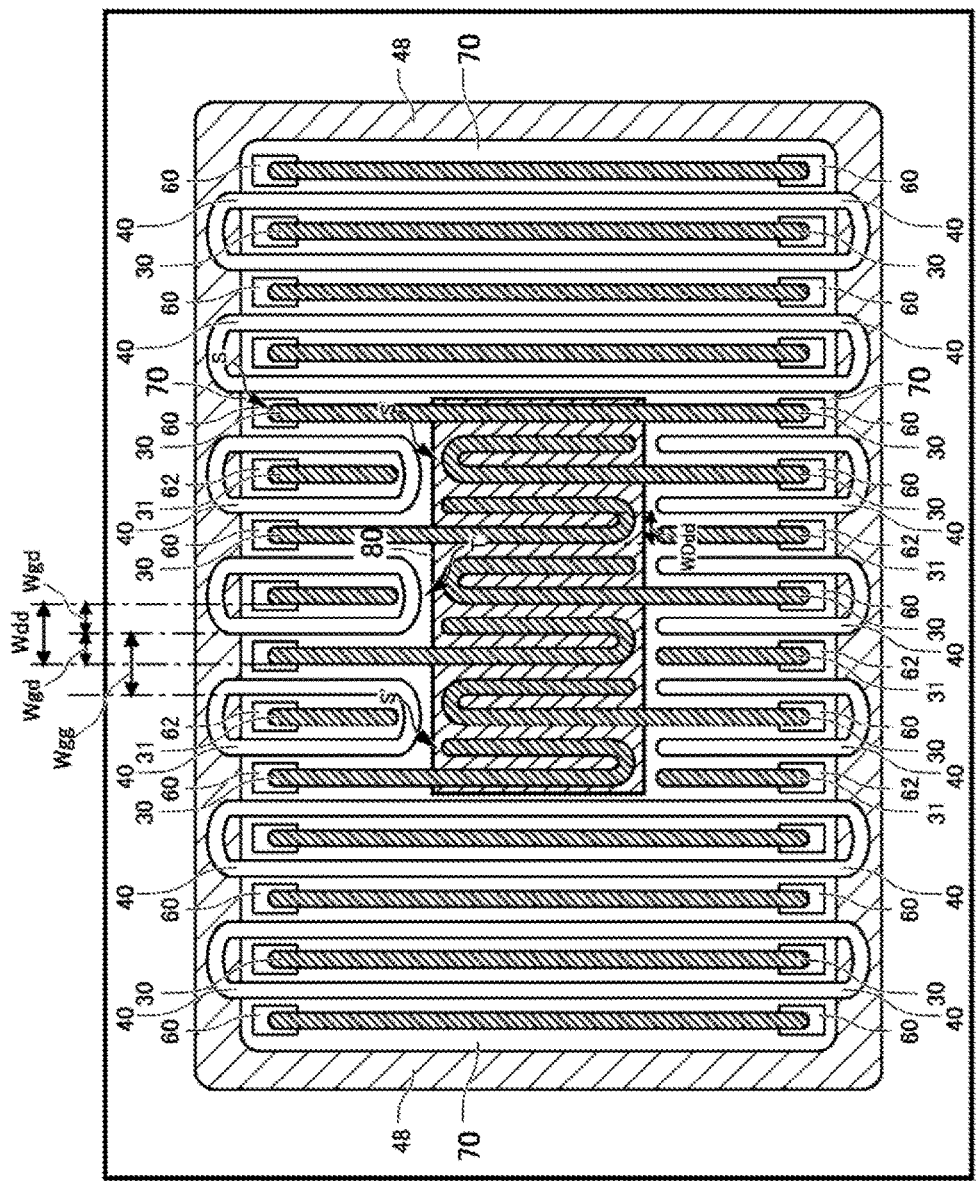
FIG. 6b illustrates another example of the upper surface of a semiconductor device 100 according to the present embodiment.

FIG. 6b illustrates another example of the upper surface of a semiconductor device 100 according to the present embodiment. The semiconductor device 100 of the present example is different from the semiconductor device 100 shown in FIG. 6a in that its gate trench portions 40 in the transistor portion 70 have annular shapes and U shapes when a semiconductor substrate 10 is seen from above. If there is a first dummy trench portion 30 between adjacent gate trench portions 40, the U shape refers to a shape made by connecting ends of the adjacent gate trench portions 40 on the outer circumferential side of the semiconductor device 100.

The gate trench portions 40 surrounding the second dummy trench portion 31 may be annular shapes or U shapes. Also, in a place where gate trench portions 40 intersect the first dummy trench portion 30 if ends of adjacent gate trench portions 40 are connected, the gate trench portions 40 have a U shape to avoid the intersection of the gate trench portion 40 and the first dummy trench portion 30. Also, the gate trench portions 40 are connected to the gate ring 48.

In the semiconductor device 100 of the present example, because ends of pairs of gate trench portions 40 provided in the transistor portion 70 are connected in U shapes, connection area between gate conductive portions in the gate trench portions 40 and the gate ring 48 can be enlarged. Thus, it is possible to further stabilize the gate potential of the transistor portion 70.

Figure 7:
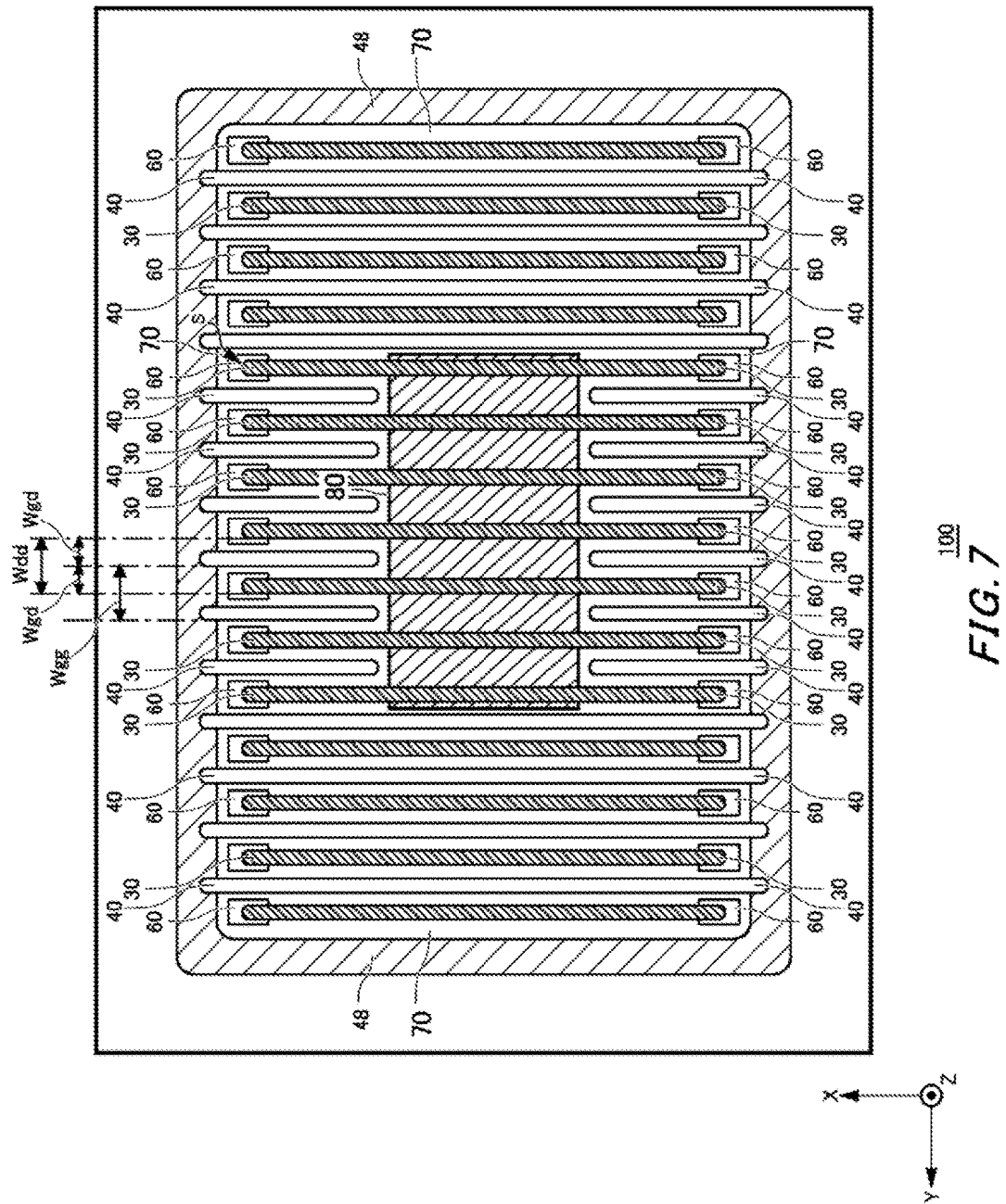
FIG. 7 illustrates another example of the upper surface of a semiconductor device 100 according to the present embodiment.

FIG. 7 illustrates another example of the upper surface of a semiconductor device 100 according to the present embodiment. The semiconductor device 100 of the present example is different from the semiconductor device 100 shown in FIG. 1 in that a first dummy trench portions 30 in a diode portion 80 are not integrally formed in a grid form but provided independent from each other.

In the semiconductor device 100 of the present example, a transistor portion 70 has the first dummy trench portions 30 that are provided in the diode portion 80 and extending outside the diode portion 80. In the diode portion 80 and the transistor portion 70, the first dummy trench portions 30 may be arrayed in the array direction at a predetermined trench pitch when a semiconductor substrate 10 is seen from above. In the present example, the first dummy trench portions 30 may be arrayed in the array direction at a pitch Wdd. Gate trench portions 40 may be arrayed in the array direction at a pitch Wgg. The pitch Wgg may be equal to the pitch Wdd. Also, a gate trench portion 40 and the first dummy trench portion 30 adjacent to the gate trench portion 40 may be arrayed in the array direction at a pitch Wgd. The pitch Wgd may be half the pitch Wgg.

In the semiconductor device 100 of the present example, the first dummy trench portion 30 in the diode portion 80 is provided extending to the transistor portion 70 outside the diode portion 80. Thus, similar to the semiconductor devices 100 shown in FIG. 1 and FIG. 6a, there is no need to provide a first lead-out portion 60 having a level difference Df, near the center of the semiconductor substrate 10. Thus, trouble such as cracks in the semiconductor substrate 10, which is prone to occur if wire bonding is performed to the first lead-out portion 60, is unlikely to occur.

Also, in the semiconductor device 100 of the present example, the first dummy trench portion 30 in the diode portion 80 is provided extending to the transistor portion 70 outside the diode portion 80, and electrically connected to the first lead-out portion 60 outside the diode portion 80. Thus, similar to the semiconductor devices 100 shown in FIG. 1 and FIG. 6a, if a trench width of the first dummy trench portion 30 is narrow, a fine process of making contact by forming a contact hole on an interlayer dielectric film (not shown) formed at the upper part of the first dummy trench portion 30 is not required. Also, if the trench width of the first dummy trench portion 30 is wide, a level difference to occur at the upper surface of the first dummy trench portion 30 due to thick polysilicon being embedded in a trench can be increased. If the difference is increased, difficulty in the process of making contact with the first dummy trench portion 30 is increased. In the semiconductor device 100 of the present example, the increase in difficulty in the process can be avoided.

Note that, as shown in FIG. 3a, in the semiconductor device 100 of the present example, ends of adjacent gate trench portions 40 may be connected in a U shape. Also, in the transistor portions 70 to which a diode portion 80 is not provided in the extending direction, ends of adjacent gate trench portions 40 may be connected to form an annular shape.

Figure 8A:
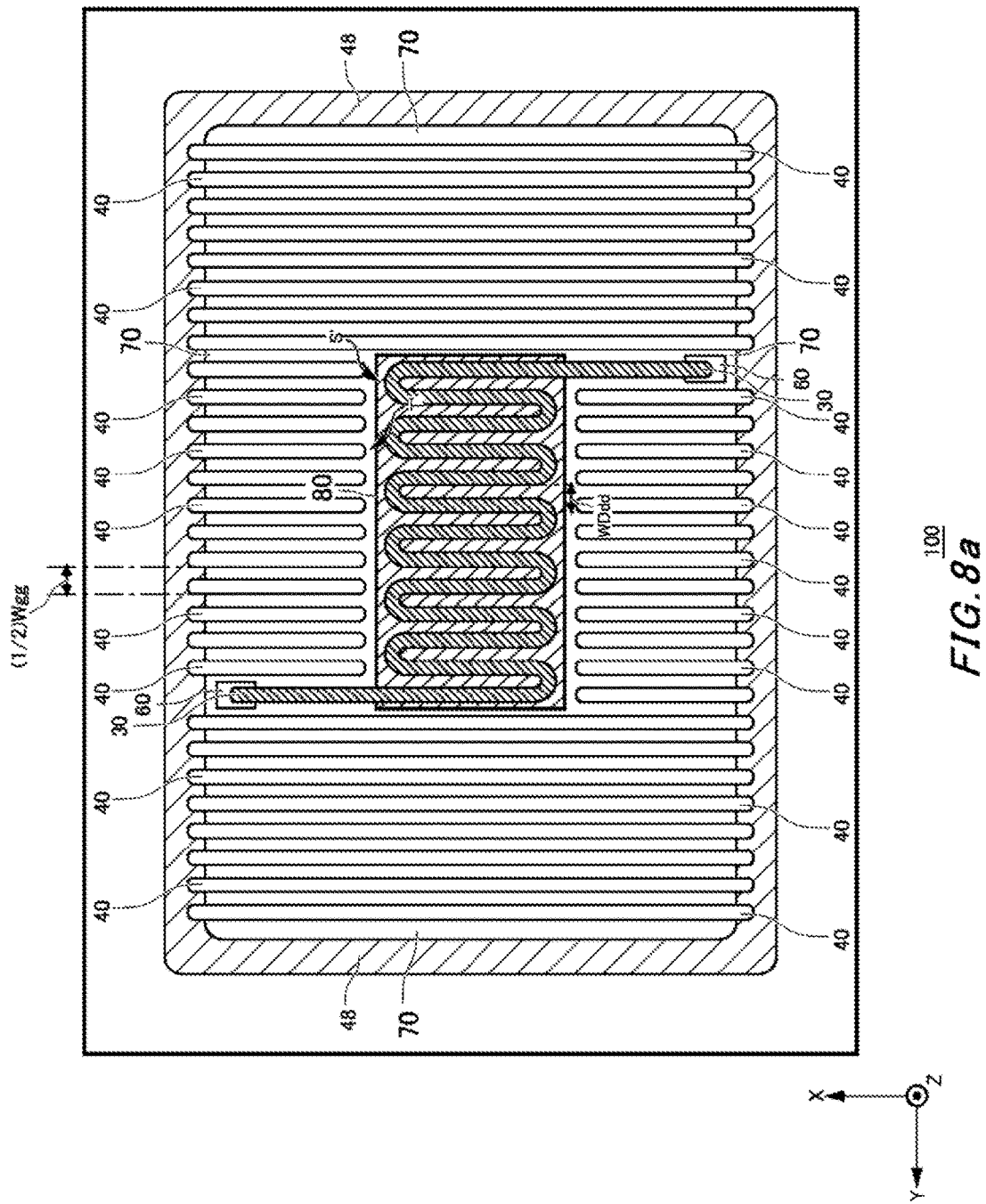
FIG. 8a illustrates another example of the upper surface of a semiconductor device 100 according to the present embodiment.

FIG. 8a illustrates another example of the upper surface of a semiconductor device 100 according to the present embodiment. The semiconductor device 100 of the present example is different from the semiconductor device 100 shown in FIG. 6a in that U shapes of a first dummy trench portion 30 is provided in a unicursal shape. Also, it is different from the semiconductor device 100 shown in FIG. 6a in that the first dummy trench portion 30 is provided in series, extending outside the diode portion 80 on the most positive side in the Y axis direction in the diode portion 80 to the +X axis direction side and on the most negative side in the Y axis direction in the diode portion 80 to the −X axis direction side, respectively. Note that, an end S' is an end of a U shape of the first dummy trench portions 30, which is on the most positive side in the X axis direction. An end T' is an end of a gate trench portion 40, which on the most negative side in the X axis direction.

The first dummy trench portion 30 on the most positive side in the Y axis direction in the diode portion 80 may be electrically connected to a first lead-out portion 60 that is adjacent to the gate ring 48 on the +X axis direction side and outside the diode portion 80. Also, the first dummy trench portion 30 on the most negative side in the Y axis direction in the diode portion 80 may be electrically connected to the first lead-out portion 60 that is adjacent to the gate ring 48 on the −X axis direction side and outside the diode portion 80.

Also, the semiconductor device 100 of the present example is different from the semiconductor device 100 shown in FIG. 6a in that transistor portions 70 are not provided with the first dummy trench portion 30 except for the parts of the first dummy trench portion 30 extending from the diode portion 80. Except for the first dummy trench portion 30 extending from inside the diode portion 80, the transistor portion 70 is provided with gate trench portions 40. That is, the semiconductor device 100 of the present example has full gate configuration.

In the transistor portion 70, the gate trench portions 40 may be arrayed in the array direction at a pitch different from the pitches Wgg shown in FIG. 1 and FIG. 6a. In the present example, the gate trench portions 40 are arrayed in the array direction at a pitch (½) Wgg. In the diode portion 80, the first dummy trench portion 30 forms U shapes, and a pitch WDdd of the first dummy trench portion 30 in the array direction may be half the pitch Wgg.

The first dummy trench portion 30 in the diode portion 80 may be provided in series, extending outside the diode portion 80 on the most positive side in the Y axis direction and the most negative side in the Y axis direction in the diode portion 80 to the +X axis direction side, respectively. Each side of the first dummy trench portion 30 may be connected to the first lead-out portion 60 adjacent to the gate ring 48 in the +X axis direction side.

The first dummy trench portion 30 in the diode portion 80 may be provided in series, extending outside the diode portion 80 on the most positive side in the Y axis direction and the most negative side in the Y axis direction in the diode portion 80 to the −X axis direction side, respectively. Each side of the first dummy trench portion 30 may be connected to the first lead-out portion 60 adjacent to the gate ring 48 in the −X axis direction side.

In the semiconductor device 100 of the present example, the first dummy trench portion 30 in the diode portion 80 is provided extending to the transistor portion 70 outside the diode portion 80. Thus, similar to the semiconductor devices 100 shown in FIG. 1, FIG. 6a, and FIG. 7, there is no need to provide the first lead-out portion 60 having a level difference Df, near the center of the semiconductor substrate 10. Thus, trouble such as cracks in the semiconductor substrate 10, which is prone to occur if wire bonding is performed to the first lead-out portion 60, is unlikely to occur.

Also, in the semiconductor device 100 of the present example, the first dummy trench portion 30 in the diode portion 80 is provided extending to the transistor portion 70 outside the diode portion 80, and electrically connected to the first lead-out portion 60 outside the diode portion 80. Thus, similar to the semiconductor devices 100 shown in FIG. 1, FIG. 6a, and FIG. 7, if a trench width of the first dummy trench portion 30 is narrow, a fine process of making contact by forming a contact hole on an interlayer dielectric film (not shown) formed at the upper part of the first dummy trench portion 30 is not required. Also, if the trench width of the first dummy trench portion 30 is wide, a level difference to occur at the upper surface of the first dummy trench portion 30 due to thick polysilicon being embedded in a trench can be increased. If the difference is increased, difficulty in the process of making contact with the first dummy trench portion 30 is increased. In the semiconductor device 100 of the present example, the increase in difficulty in the process can be avoided.

Also, similar to the semiconductor device 100 shown in FIG. 6a, because the semiconductor device 100 of the present example has the first dummy trench portion 30 having U shapes, and does not have trenches intersecting each other in T shapes or cross shapes shown in the semiconductor device 100 in FIG. 1, enlargement of trench widths that is prone to occur at the intersection parts does not occur. That is, the semiconductor device 100 of the present example allows a trench width of the first dummy trench portion 30 to be uniform. Thus, occurrence of a drop region of polysilicon can be suppressed, which results from an enlarged trench width. Thus, the drop region of polysilicon can be prevented from dropping deep relative to a linear trench portion.

Also, compared with the semiconductor devices 100 shown in FIG. 1, FIG. 6a, and FIG. 7, the semiconductor device 100 of the present example has multiple gate trench portions 40 provided at high density in the transistor portion

70. Thus, its saturation current can be higher than saturation current of semiconductor devices 100 shown in FIG. 1, FIG. 6a, and FIG. 7.

Figure 8B:
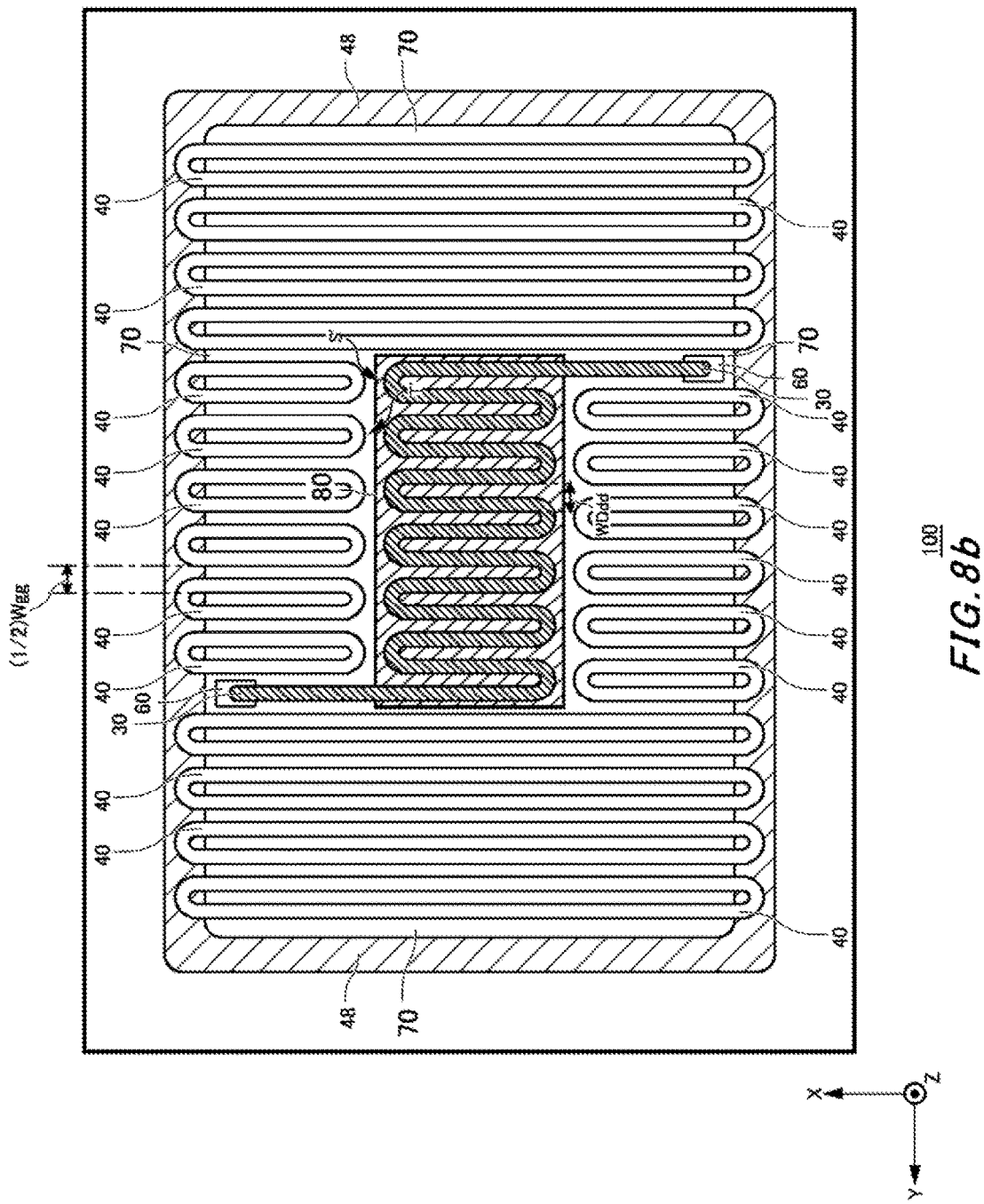
FIG. 8b illustrates another example of the upper surface of a semiconductor device 100 according to the present embodiment.

FIG. 8b illustrates another example of the upper surface of a semiconductor device 100 according to the present embodiment. The semiconductor device 100 of the present example is different from the semiconductor device 100 shown in FIG. 8a in that gate trench portions 40 are provided in annular shapes.

In the semiconductor device 100 of the present example, because ends of pairs of gate trench portions 40 provided in the transistor portion 70 are connected in U shapes, connection area between gate conductive portions in the gate trench portions 40 and the gate ring 48 can be enlarged. Thus, it is possible to further stabilize the gate potential of the transistor portion 70.

Also, in the semiconductor device 100 of the present example, first dummy trench portions 30 are not surrounded by gate trench portions 40 that are in annular shapes. Even if the gate trench portions 40 are made to have annular shapes in a manner similar to the present example, the similar effect as the effect of FIG. 8a can still be obtained. Furthermore, by making the gate trench portions 40 have annular shapes, even if one of a pair of gate trench portions 40 extending in the X axis direction is disconnected due to trouble, the gate trench portions 40 will not be in a floating state. Thereby, it is possible to improve reliability of the semiconductor device 100.

Note that, if there is no need in making saturation current higher in the transistor portion 70, a first dummy trench portion 30, a second dummy trench portion 31, a first lead-out portion 60, and a second lead-out portion 62 may be included between adjacent gate trench portions 40 in the transistor portion 70, in a manner similar to FIG. 6a and FIG. 7. Also, ends of adjacent gate trench portions 40 may be connected in an annular shape or a U shape in a manner similar to FIG. 6b.

Figure 9:
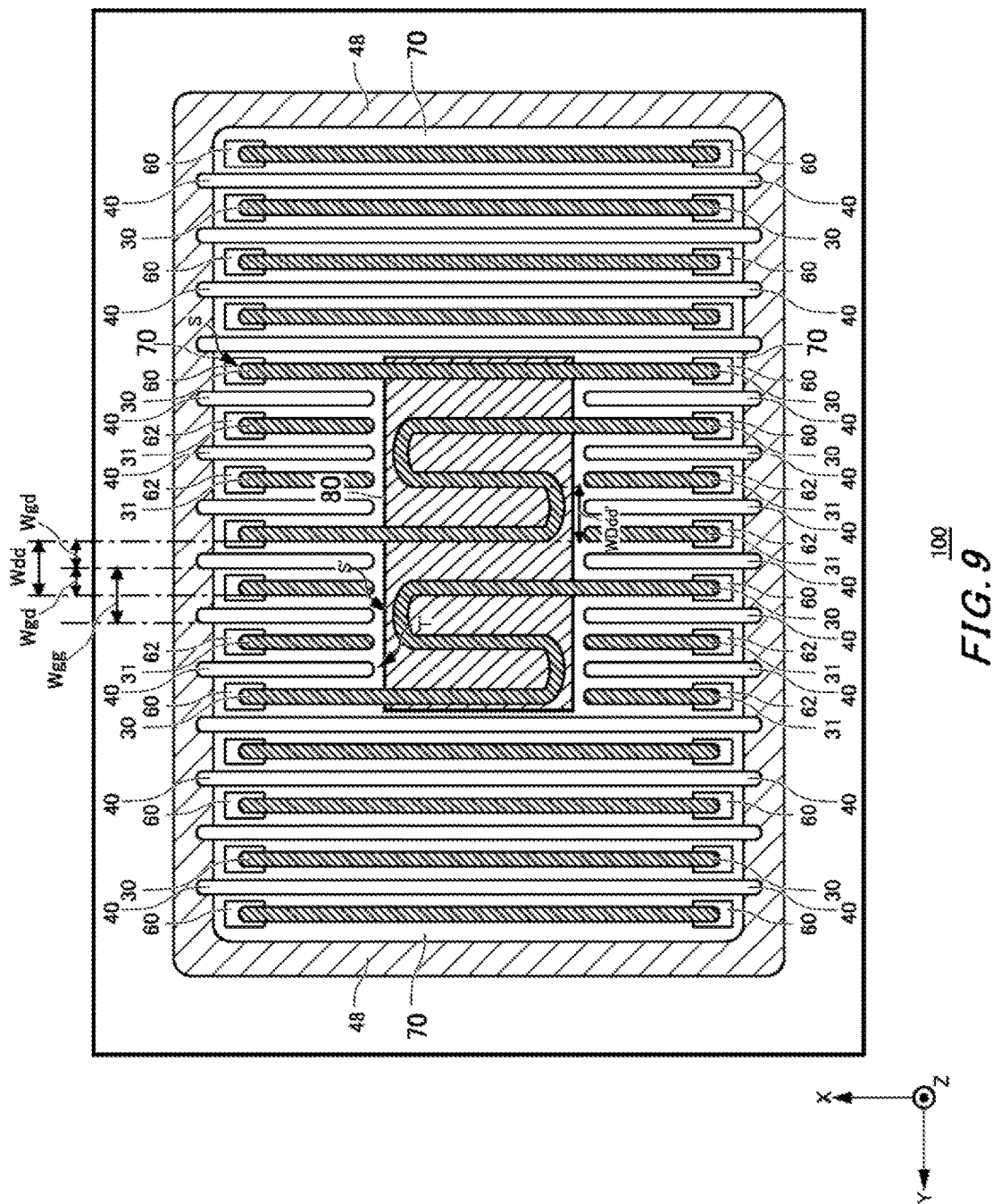
FIG. 9 illustrates another example of the upper surface of a semiconductor device 100 according to the present embodiment.

FIG. 9 illustrates another example of the upper surface of a semiconductor device 100 according to the present embodiment. In the semiconductor device 100 of the present example, a pair of first dummy trench portions 30 have a U shape in a diode portion 80 and extend in the extending direction. The semiconductor device 100 is different from the semiconductor device 100 shown in FIG. 6a in that a pitch WDdd' of the first dummy trench portions 30 in the Y axis direction is larger than the pitch WDdd in the semiconductor device 100 shown in FIG. 6a. Similar to the semiconductor devices 100 shown in FIG. 6a and FIG. 8b, the semiconductor device 100 of the present example also have the first dummy trench portions 30 having U shapes in the diode portion 80. Note that, an end S' is an end of a U shape of the first dummy trench portions 30, which on the most positive side in the X axis direction. An end T' is an end of a gate trench portion 40, which is on the most negative side in the X axis direction.

The pitch WDdd' may be larger than half a pitch Wdd of the gate trench portion 40 in the array direction in the transistor portion 70. The pitch WDdd' may be equal to the pitch Wdd. FIG. 9 shows an example in which the pitch WDdd' is equal to the pitch Wdd.

In the semiconductor device 100 of the present example, a first dummy trench portion 30 in the diode portion 80 is provided extending to the transistor portion 70 outside the diode portion 80. Thus, similar to the semiconductor devices 100 shown in FIG. 1, and from FIG. 6a to FIG. 8b, there is no need to provide a first lead-out portion 60 having a level difference Df, near the center of a semiconductor substrate 10. Thus, trouble such as cracks in the semiconductor substrate 10, which is prone to occur if wire bonding is performed to the first lead-out portion 60, is unlikely to occur.

Also, in the semiconductor device 100 of the present example, the first dummy trench portions 30 in the diode portion 80 is provided extending to the transistor portion 70 outside the diode portion 80, and electrically connected to the first lead-out portions 60 outside the diode portion 80. Thus, similar to the semiconductor devices 100 shown in FIG. 1, and from FIG. 6a to FIG. 8b, if a trench width of the first dummy trench portion 30 is narrow, a fine process of making contact by forming a contact hole on an interlayer dielectric film (not shown) formed at the upper part of the first dummy trench portion 30 is not required. Also, if the trench width of the first dummy trench portion 30 is wide, a level difference to occur at the upper surface of the first dummy trench portion 30 due to thick polysilicon being embedded in a trench can be increased. If the difference is increased, difficulty in the process of making contact with the first dummy trench portion 30 is increased. In the semiconductor device 100 of the present example, the increase in difficulty in the process can be avoided.

Also, similar to the semiconductor devices 100 shown in FIG. 6a and FIG. 8b, because the semiconductor device 100 of the present example has the first dummy trench portions 30 having U shapes, and does not have trenches intersecting each other in T shapes or cross shapes shown in the semiconductor device 100 in FIG. 1, enlargement of trench widths that is prone to occur at the intersection parts does not occur. That is, the semiconductor device 100 of the present example allows trench widths of the first dummy trench portions 30 to be uniform. Thus, occurrence of a drop region of polysilicon can be suppressed, which results from an enlarged trench width. Thus, the drop region of polysilicon can be prevented from dropping deep relative to a linear trench portion.

Also, in the semiconductor device 100 of the present example, the pitch WDdd' of the first dummy trench portions 30 in the Y axis direction in the diode portion 80 is larger than the pitch WDdd of the semiconductor device 100 shown in FIG. 6a. Thus, by making a doping concentration of a base region 14 in the diode portion 80 lower than a doping concentration of a well region 11 in the transistor portion 70, withstand voltage of the diode portion 80 can be improved. Also, by making the depth in the base region 14 of the diode portion 80 deeper than the depth of the well region 11 in the transistor portion 70, even if the doping concentration of the base region 14 is substantially the same as the doping concentration of the well region 11, withstand voltage of the diode portion 80 can be improved.

In the semiconductor device 100 of the present example, the gate trench portions 40 in the transistor portion 70 may have annular shapes and U shapes in a manner similar to the semiconductor device 100 shown in FIG. 6b. The second dummy trench portion 31 may be surrounded by the gate trench portions 40 having an annular shape. Also, because the first dummy trench portions 30 intersect the gate trench portions 40 having annular shapes, the first dummy trench portions 30 may not be surrounded by the gate trench portions 40 having annular shapes. Some of the second dummy trench portions 31 may also not be surrounded by the gate trench portions 40 having annular shapes. A pair of adjacent gate trench portions 40 may have an annular shape or a U shape by connecting ends of the gate trench portions 40.

Figure 10:
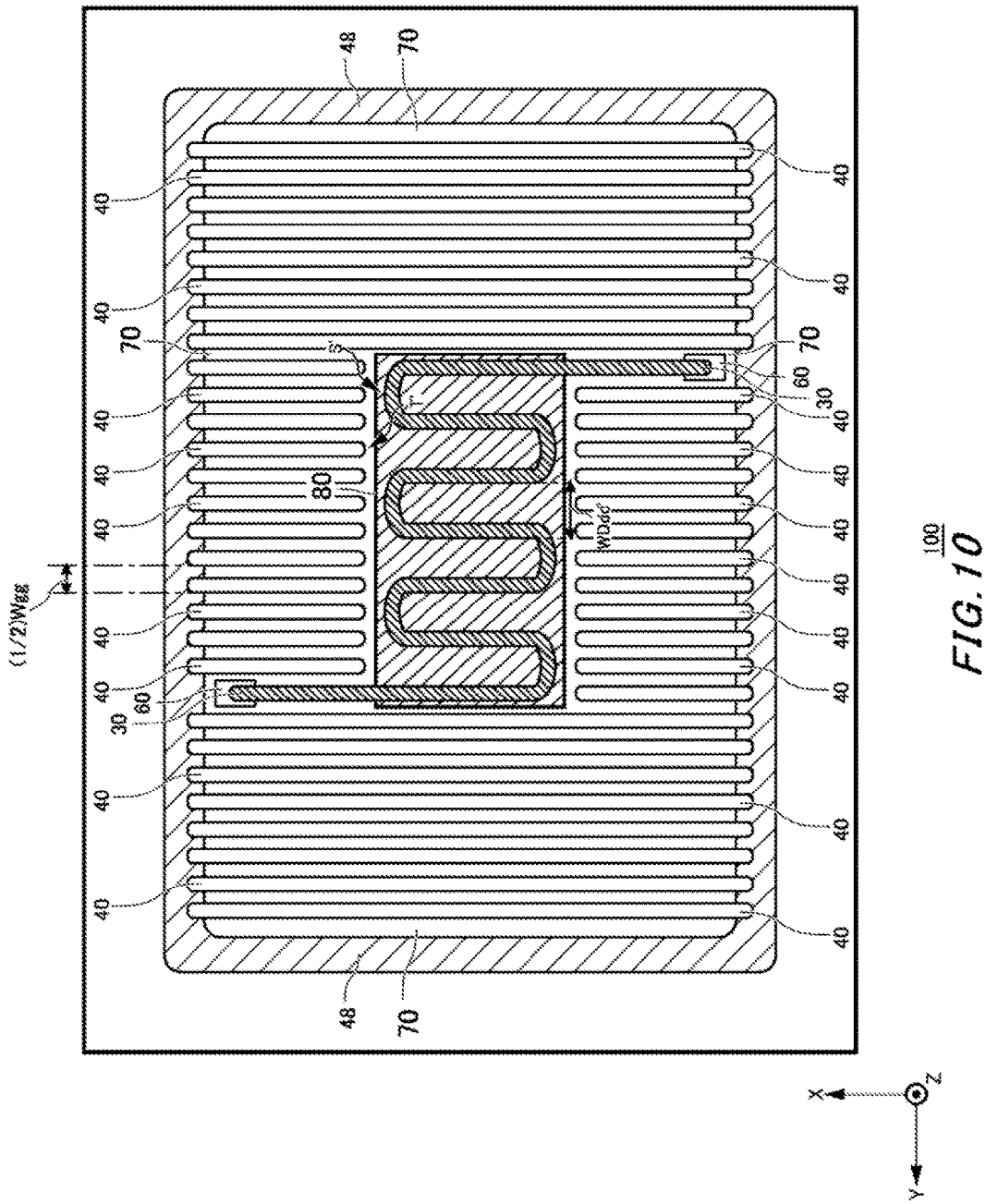
FIG. 10 illustrates another example of the upper surface of a semiconductor device 100 according to the present embodiment.

FIG. 10 illustrates another example of the upper surface of a semiconductor device 100 according to the present embodiment. The semiconductor device 100 of the present example is different from the semiconductor device 100 shown in FIG. 8a, in that a trench pitch WDdd' of a first dummy trench portion 30 in a diode portion 80 is larger than a trench pitch WDdd of the semiconductor device 100 shown in FIG. 8a. Similar to the semiconductor device 100 shown in FIG. 8a, in the semiconductor device 100 of the present example, the first dummy trench portion 30 in the diode portion 80 is provided in a unicursal shape having U shapes.

In the semiconductor device 100 of the present example, except for the first dummy trench portion 30 extending from inside the diode portion 80, a transistor portion 70 is provided with gate trench portions 40. That is, the semiconductor device 100 of the present example has full gate configuration. In the transistor portion 70, the gate trench portions 40 may be provided in the Y axis direction at a trench pitch (½) Wgg. The pitch Wgg may be half the pitch Wdd of FIG. 9. Note that, an end S' is an end of a U shape of the first dummy trench portions 30, which is on the most positive side in the X axis direction. An end T' is an end of a gate trench portion 40, which is on the most negative side in the X axis direction.

The pitch WDdd' may be larger than the pitch (½) Wgg of the gate trench portion 40 in the array direction in the transistor portion 70. The pitch WDdd' may be equal to twice the pitch (½) Wgg, i.e. the Wgg. FIG. 10 shows an example in which the pitch WDdd' is equal to the pitch Wgg.

In the semiconductor device 100 of the present example, the first dummy trench portion 30 in the diode portion 80 is provided extending to the transistor portion 70 outside the diode portion 80. Thus, similar to the semiconductor devices 100 shown in FIG. 1, and from FIG. 6a to FIG. 9, there is no need to provide a first lead-out portion 60 having a level difference Df, near the center of the semiconductor substrate 10. Thus, trouble such as cracks in the semiconductor substrate 10, which is prone to occur if wire bonding is performed to the first lead-out portion 60, is unlikely to occur.

Also, in the semiconductor device 100 of the present example, the first dummy trench portion 30 in the diode portion 80 is provided extending to the transistor portion 70 outside the diode portion 80, and electrically connected to the first lead-out portion 60 outside the diode portion 80. Thus, similar to the semiconductor devices 100 shown in FIG. 1, and from FIG. 6a to FIG. 9, if a trench width of the first dummy trench portion 30 is narrow, a fine process of making contact by forming a contact hole on an interlayer dielectric film (not shown) formed at the upper part of the first dummy trench portion 30 is not required. Also, if the trench width of the first dummy trench portion 30 is wide, a level difference to occur at the upper surface of the first dummy trench portion 30 due to thick polysilicon being embedded in a trench can be increased. If the difference is increased, difficulty in the process of making contact with the first dummy trench portion 30 is increased. In the semiconductor device 100 of the present example, the increase in difficulty in the process can be avoided.

Also, similar to the semiconductor devices 100 shown in FIG. 6a, FIG. 8a, and FIG. 9, because the semiconductor device 100 of the present example has the first dummy trench portion 30 having U shapes, and does not have trenches intersecting each other in T shapes or cross shapes shown in the semiconductor device 100 in FIG. 1, enlargement of trench widths that is prone to occur at the intersection parts does not occur. That is, the semiconductor device 100 of the present example allows a trench width of the first dummy trench portion 30 to be uniform. Thus, occurrence of a drop region of polysilicon can be suppressed, which results from an enlarged trench width. Thus, the drop region of polysilicon can be prevented from dropping deep relative to a linear trench portion.

In the semiconductor device 100 of the present example, the gate trench portions 40 may be provided in annular shapes in a manner similar to the semiconductor device 100 shown in FIG. 8b. Also, a first dummy trench portion 30 is not surrounded by gate trench portions 40 having an annular shape.

Note that, a first dummy trench portion 30, a second dummy trench portion 31, a first lead-out portion 60, and a second lead-out portion 62 may be included between adjacent gate trench portions 40 in the transistor portion 70, in a manner similar to FIG. 6a and FIG. 7. Also, ends of adjacent gate trench portions 40 may be connected in an annular shape or a U shape in a manner similar to FIG. 6b.

Figure 11:
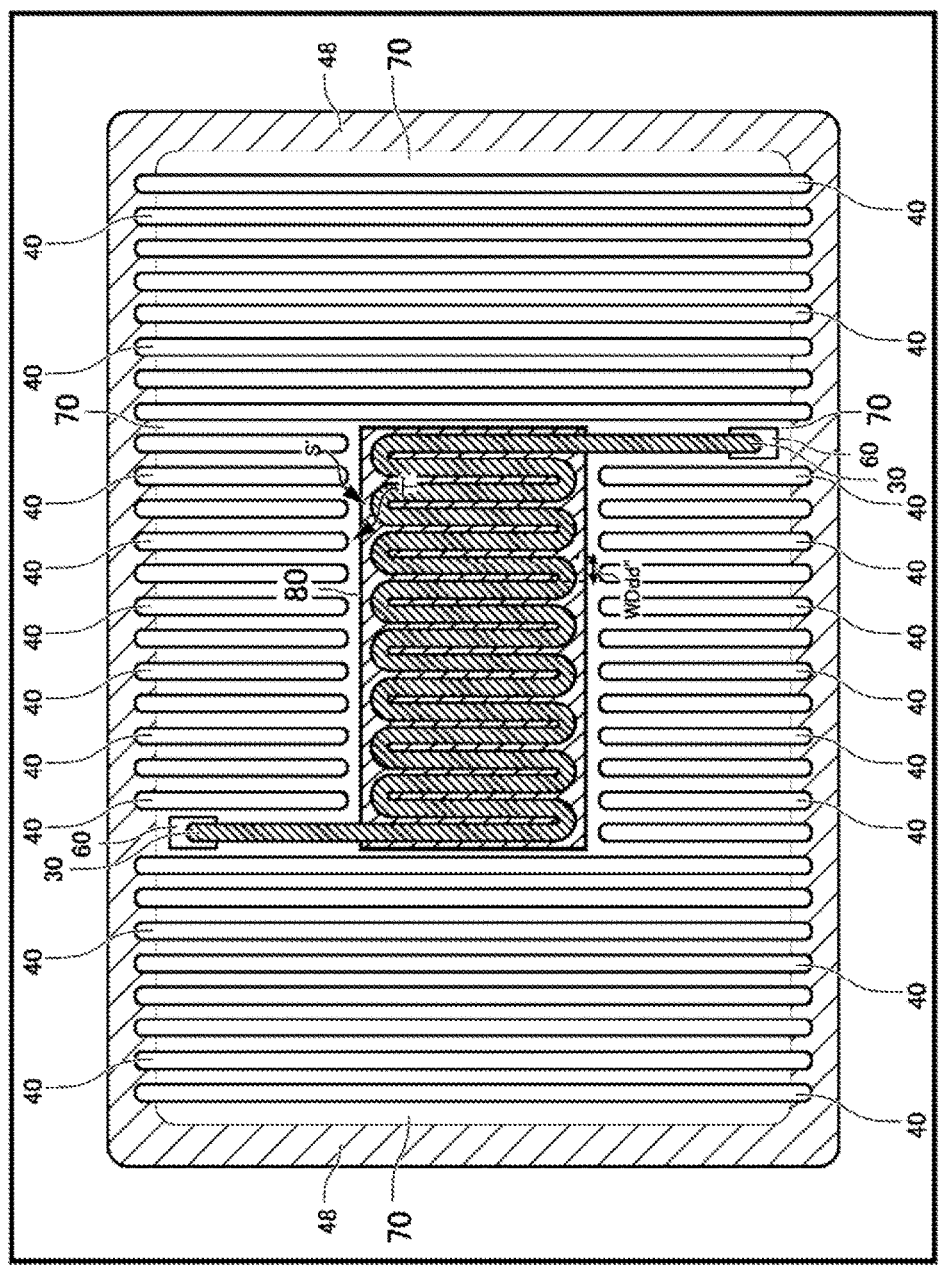
FIG. 11 illustrates another example of the upper surface of a semiconductor device 100 according to the present embodiment.

FIG. 11 illustrates another example of the upper surface of a semiconductor device 100 according to the present embodiment. The semiconductor device 100 of the present example is different from the semiconductor device 100 shown in FIG. 8a in that a trench pitch WDdd of a first dummy trench portion 30 in a diode portion 80 is provided at a pitch WDdd" smaller than a pitch WDdd of the semiconductor device 100 shown in FIG. 8a. Similar to the semiconductor devices 100 shown in FIG. 8a and FIG. 10, in the semiconductor device 100 of the present example also, the first dummy trench portion 30 in the diode portion 80 is provided in a unicursal shape having U shapes.

In the semiconductor device 100 of the present example, except for the first dummy trench portion 30 extending from inside the diode portion 80, a transistor portion 70 is provided with gate trench portions 40. That is, the semiconductor device 100 of the present example has full gate configuration. In the transistor portion 70, the gate trench portions 40 may be provided in the Y axis direction at a trench pitch (½) Wgg. The pitch Wgg may be half the pitch Wdd of FIG. 9. The pitch WDdd" may be smaller than the pitch (½) Wgg of the gate trench portion 40 in the array direction in transistor portion 70. Note that, an end S' is an end of a U shape of the first dummy trench portions 30, which is on the most positive side in the X axis direction. An end T' is an end of a gate trench portion 40, which is on the most negative side in the X axis direction.

In the semiconductor device 100 of the present example, the first dummy trench portion 30 in the diode portion 80 is provided extending to the transistor portion 70 outside the diode portion 80. Thus, similar to the semiconductor devices 100 shown in FIG. 1, and from FIG. 6a to FIG. 10, there is no need to provide the first lead-out portion 60 having a level difference Df, near the center of the semiconductor substrate 10. Thus, trouble such as cracks in the semiconductor substrate 10, which is prone to occur if wire bonding is performed to the first lead-out portion 60, is unlikely to occur.

Also, in the semiconductor device 100 of the present example, the first dummy trench portion 30 in the diode portion 80 is provided extending to the transistor portion 70 outside the diode portion 80, and electrically connected to the first lead-out portion 60 outside the diode portion 80. Thus, similar to the semiconductor devices 100 shown in FIG. 1, and from FIG. 6a to FIG. 10, if a trench width of the first dummy trench portion 30 is narrow, a fine process of making contact by forming a contact hole on an interlayer dielectric film (not shown) formed at the upper part of the first dummy trench portion 30 is not required. Also, if the trench width of the first dummy trench portion 30 is wide, a level difference to occur at the upper surface of the first dummy trench portion 30 due to thick polysilicon being embedded in a trench can be increased. If the difference is increased, difficulty in the process of making contact with the first dummy trench portion 30 is increased. In the semiconductor device 100 of the present example, the increase in difficulty in the process can be avoided.

Also, similar to the semiconductor devices 100 shown in FIG. 6a, FIG. 8a, FIG. 9, and FIG. 10, because the semiconductor device 100 of the present example has the first dummy trench portion 30 having U shapes, and does not have trenches intersecting each other in T shapes or cross shapes shown in the semiconductor device 100 in FIG. 1, enlargement of trench widths that is prone to occur at the intersection parts does not occur. That is, the semiconductor device 100 of the present example allows a trench width of the first dummy trench portion 30 to be uniform. Thus, occurrence of a drop region of polysilicon can be suppressed, which results from an enlarged trench width. Thus, the drop region of polysilicon can be prevented from dropping deep relative to a linear trench portion.

Also, in the semiconductor device 100 of the present example, the first dummy trench portion 30 in the diode portion 80 is provided at density higher than the density of the first dummy trench portion 30 in the semiconductor device 100 shown in FIG. 8a. Thus, withstand voltage of the diode portion 80 can be improved further compared to withstand voltage of the semiconductor device 100 shown in FIG. 8a. Note that, withstand voltage of the diode portion 80 can be adjusted by density of the first dummy trench portion 30 and a doping concentration of the base region 14.

In the semiconductor device 100 of the present example, the gate trench portions 40 may be provided in annular shapes in a manner similar to the semiconductor device 100 shown in FIG. 8b. Also, the first dummy trench portion 30 is not surrounded by gate trench portions 40 having an annular shape.

Note that, a first dummy trench portion 30, a second dummy trench portion 31, a first lead-out portion 60, and a second lead-out portion 62 may be included between adjacent gate trench portions 40 in the transistor portion 70, in a manner similar to FIG. 6a and FIG. 7. Also, ends of adjacent gate trench portions 40 may be connected in an annular shape or a U shape in a manner similar to FIG. 6b.

Although the embodiments of the present invention have been described above, the technical scope of the invention is not limited to the embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, stages, and the like of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
    a semiconductor substrate having a drift region of a first conductivity type;
    a cathode region formed on a lower surface of the semiconductor substrate;
    a diode portion having the cathode region formed on the lower surface of the semiconductor substrate;
    a first dummy trench portion provided from an upper surface of the semiconductor substrate to the drift region, including one part provided inside the diode portion and the other part provided outside the diode portion, and provided extending in series from inside the diode portion to outside the diode portion in a predetermined extending direction on the upper surface of the semiconductor substrate; and
    a first lead-out portion provided on the upper surface of the semiconductor substrate, and electrically connected to the first dummy trench portion outside the diode portion.

2. The semiconductor device according to claim 1, further comprising:
    a transistor portion provided adjacent to the diode portion in the extending direction on the semiconductor substrate when the semiconductor substrate is seen from above, wherein
        the transistor portion has the first dummy trench portion, and
        the first dummy trench portion is arrayed in an array direction orthogonal to the extending direction at a predetermined trench pitch in the diode portion and the transistor portion when the semiconductor substrate is seen from above.

3. The semiconductor device according to claim 2, further comprising:
    a second lead-out portion provided on the upper surface of the semiconductor substrate, wherein
        the transistor portion further have a second dummy trench portion extending in the extending direction and inwardly provided from the upper surface of the semiconductor substrate,
        the second dummy trench portion is electrically connected to the second lead-out portion, and
        the first lead-out portion and the second lead-out portion are arrayed in the array direction.

4. The semiconductor device according to claim 2, wherein
    the transistor portion further have a gate trench portion extending in the extending direction and inwardly provided from the upper surface of the semiconductor substrate, and
    the gate trench portion is arrayed in the array direction at a trench pitch different from the predetermined trench pitch.

5. The semiconductor device according to claim 4, wherein a distance in the extending direction between an end of the gate trench portion on the diode portion side and an end of the first dummy trench portion in the diode portion is no greater than twice a trench pitch in the array direction between the gate trench portion in the transistor portion and the first dummy trench portion adjacent to the gate trench portion, when the semiconductor substrate is seen from above.

6. The semiconductor device according to claim 4, wherein
    the transistor portion has a plurality of emitter regions being in direct contact with the gate trench portion and arrayed in the extending direction on the upper surface of the semiconductor substrate, and a distance in the extending direction between an end of the gate trench portion on the diode portion side and the emitter region provided on a side closest to the diode portion in the transistor portion is smaller than a distance in the extending direction between an end opposite to the end on the diode portion side of the gate trench portion and the emitter region provided farthest from the diode portion in the extending direction, when the semiconductor substrate is seen from above.

7. The semiconductor device according to claim 4, wherein the transistor portion has a collector region on the lower surface of the semiconductor substrate, and a boundary between the cathode region and the collector region is positioned on a side closer to the transistor portion relative to a midpoint in the extending direction between an end of the gate trench portion on the diode portion side and an end of the first dummy trench portion in the diode portion, when the semiconductor substrate is seen from above.

8. The semiconductor device according to claim 4, wherein the transistor portion has a collector region on the lower surface of the semiconductor substrate, and a boundary between the cathode region and the collector region is positioned on a side closer to the diode portion relative to a midpoint in the extending direction between an end of the gate trench portion on the diode portion side and an end of the first dummy trench portion in the diode portion, when the semiconductor substrate is seen from above.

9. The semiconductor device according to claim 2, further comprising:

a plurality of first dummy trench portions, each of which is the first dummy trench portion, wherein a trench pitch between the first dummy trench portions adjacent to each other in the array direction is smaller than half the predetermined trench pitch in the diode portion.

10. The semiconductor device according to claim 2, wherein a trench pitch between the first dummy trench portions adjacent to each other in the array direction is larger than half the predetermined trench pitch in the diode portion.

11. The semiconductor device according to claim 1, wherein the first dummy trench portion has a U shape in the diode portion when the semiconductor substrate is seen from above.

12. The semiconductor device according to claim 11, wherein the first dummy trench portion has a unicursal shape in the diode portion when the semiconductor substrate is seen from above.

* * * * *